(12) United States Patent
Kanda et al.

(10) Patent No.: US 8,697,329 B2
(45) Date of Patent: *Apr. 15, 2014

(54) POSITIVE RESIST COMPOSITION AND PATTERN FORMING METHOD USING THE SAME

(75) Inventors: Hiromi Kanda, Haibara-gun (JP); Shinichi Kanna, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 341 days.

This patent is subject to a terminal disclaimer.

(21) Appl. No.: 12/046,204

(22) Filed: Mar. 11, 2008

(65) Prior Publication Data

US 2008/0171287 A1 Jul. 17, 2008

Related U.S. Application Data

(63) Continuation of application No. 11/636,483, filed on Dec. 11, 2006, now Pat. No. 7,368,220.

(30) Foreign Application Priority Data

Dec. 9, 2005 (JP) ................. 2005-356718

(51) Int. Cl.
*G03F 7/039* (2006.01)
*G03F 7/075* (2006.01)
*G03F 7/20* (2006.01)
*G03F 7/30* (2006.01)

(52) U.S. Cl.
USPC ........ 430/270.1; 430/311; 430/326; 430/907; 430/910

(58) Field of Classification Search
None
See application file for complete search history.

(56) References Cited

U.S. PATENT DOCUMENTS

| | | | |
|---|---|---|---|
| 5,286,597 A * | 2/1994 | Suzuki et al. ................. | 430/262 |
| 6,210,856 B1 | 4/2001 | Lin et al. | |
| 6,589,705 B1 * | 7/2003 | Sato et al. ................. | 430/270.1 |
| 6,852,467 B2 | 2/2005 | Aoai et al. | |
| 7,531,287 B2 * | 5/2009 | Kanda et al. ............... | 430/270.1 |
| 2002/0012874 A1 | 1/2002 | Namba | |
| 2002/0061465 A1 * | 5/2002 | Hasegawa et al. ......... | 430/270.1 |
| 2003/0175617 A1 | 9/2003 | Kato et al. | |
| 2005/0095532 A1 | 5/2005 | Kodama et al. | |
| 2005/0147920 A1 * | 7/2005 | Lin et al. ........ | 430/311 |
| 2005/0171226 A1 | 8/2005 | Nishimura et al. | |
| 2005/0233254 A1 * | 10/2005 | Hatakeyama et al. ........ | 430/311 |
| 2006/0222866 A1 | 10/2006 | Nakamura et al. | |
| 2006/0228648 A1 | 10/2006 | Ohsawa et al. | |
| 2006/0246373 A1 | 11/2006 | Wang | |
| 2007/0099112 A1 | 5/2007 | Kobayashi et al. | |
| 2007/0099113 A1 | 5/2007 | Kobayashi et al. | |
| 2007/0105045 A1 | 5/2007 | Iwato et al. | |
| 2007/0178405 A1 * | 8/2007 | Kanda et al. ............... | 430/270.1 |
| 2009/0068586 A1 | 3/2009 | Nakamura et al. | |

FOREIGN PATENT DOCUMENTS

| | | |
|---|---|---|
| EP | 1 324 134 A2 | 7/2003 |
| EP | 1 517 179 A1 * | 3/2005 |
| EP | 1 566 693 A2 | 8/2005 |
| JP | 57-153433 A | 9/1982 |
| JP | 08-202038 | 8/1996 |
| JP | 2000-221686 A | 8/2000 |
| JP | 2000-338676 A | 12/2000 |
| JP | 3202979 B2 | 6/2001 |
| JP | 2003-262952 * | 9/2003 |
| JP | 3672780 B2 | 4/2005 |
| JP | 2005-134456 | 5/2005 |
| TW | 200303454 A | 9/2003 |
| TW | 200516349 A | 5/2005 |
| WO | WO 02/082184 A1 | 10/2002 |
| WO | 2004/076535 A1 | 9/2004 |
| WO | WO 2004/068242 A1 | 12/2004 |

OTHER PUBLICATIONS

Machine-assisted English translation of JP2003-262952 as provided by JPO (2003).*
European Search Report dated Mar. 20, 2007 English.
B.J. Lin "Semiconductor Foundry, Lithography, and Partners" Micropatterning Division TSMC, Inc., Proceedings of SPIE vol. 4688 2002, pp. 11-24.
J.A. Hoffnagle, et al. "Liquid Immersion Deep-Ultraviolet Interferometric Lithography", J. Vac. Sci, Technol. B 17(s), Nov./Dec. 1999 American Vacuum Society, pp. 3306-3309.
Communication dated Sep. 12, 2012 from the Taiwanese Intellectual Property Office in Taiwanese application No. 095145561.
Office Action dated May 29, 2013 issued by the Taiwanese Patent Office in counterpart Taiwanese Application No. 095145561.

* cited by examiner

*Primary Examiner* — Sin J. Lee
(74) *Attorney, Agent, or Firm* — Sughrue Mion, PLLC

(57) ABSTRACT

A positive resist composition, which comprises: (A) a resin of which solubility in an alkali developer increases under an action of an acid; (B) a compound capable of generating an acid upon irradiation with actinic rays or radiation; (C) a resin having at least one of a fluorine atom and a silicon atom; and (D) a solvent, wherein the resin (C) contains at least one of: (C1) a resin having at least one of a fluorine atom and a silicon atom and having an alicyclic structure; and (C2) a resin containing a repeating unit having at least one of a fluorine atom and a silicon atom in a side chain and a repeating unit having an unsubstituted alkyl group in a side chain; and a pattern forming method.

27 Claims, No Drawings

US 8,697,329 B2

POSITIVE RESIST COMPOSITION AND PATTERN FORMING METHOD USING THE SAME

CROSS REFERENCE TO RELATED APPLICATIONS

This application is a continuation of U.S. application Ser. No. 11/636,483, filed Dec. 11, 2006, which claims priority to Japanese Application No. 2005-356718, filed Dec. 9, 2005. The entire disclosure of the prior application, application Ser. No. 11/636,483, is considered part of the disclosure of the accompanying continuation application and is hereby incorporated by reference.

BACKGROUND OF THE INVENTION

1. Field of the Invention

The present invention relates to a positive resist composition for use in the production process of a semiconductor such as IC, in the production of a circuit substrate of liquid crystal, thermal head or the like, and in the lithography process of other photo-applications; and a pattern forming method using the composition. More specifically, the present invention relates to a positive resist composition for immersion exposure, which is suitable for exposure by an immersion-type projection exposure apparatus using a light source of emitting far ultraviolet light at a wavelength of 300 nm or less; and a pattern forming method using the composition.

2. Description of the Related Art

Along with the miniaturization of semiconductor devices, the trend is moving into shorter wavelength of the exposure light source and higher numerical aperture (high NA) of the projection lens. At present, an exposure machine with NA of 0.84 has been developed, where an ArF excimer laser having a wavelength of 193 nm is used as the light source. As commonly well known, these can be expressed by the following formulae:

(Resolving power)=$k_1 \cdot (\lambda/NA)$ (Focal depth)=$\pm k_2 / NA^2$ wherein $\lambda$ is the wavelength of the exposure light source, NA is the numerical aperture of the projection lens, and $k_1$ and $k_2$ are constants related to the process.

In order to realize still shorter wavelength and higher resolving power, studies are being made on an exposure machine where an $F_2$ excimer laser having a wavelength of 157 nm is used as the light source. However, the lens material used for the exposure apparatus so as to realize shorter wavelength and the material used for the resist are very limited and therefore, it is extremely difficult to stabilize the production cost or quality of the apparatus and materials. This may lead to a failure in procuring the exposure apparatus and the resist each assured of sufficiently high performance and stability within a required time period.

Conventionally, a so-called immersion method of filling a high refractive-index liquid (hereinafter sometimes referred to as an "immersion liquid") between the projection lens and the sample has been known as a technique of increasing the resolving power in an optical microscope.

As for the "effect of immersion", assuming that the wavelength of exposure light in air is $\lambda_0$, the refractive index of the immersion liquid to air is n, the convergence half-angle of beam is $\theta$ and $NA_0 = \sin\theta$, the above-described resolving power and focal depth when immersed can be expressed by the following formulae:

(Resolving power)=$k_1 (\lambda_0/n)/NA_0$ (Focal depth)=$\pm k_2 \cdot (\lambda_0/n)/NA_0^2$ That is, the effect of immersion is equal to use of an exposure wavelength of 1/n. In other words, in the case of a projection optical system with the same NA, the focal depth can be made n times larger by the immersion. This is effective for all pattern profiles and can be combined with super-resolution techniques such as phase-shift method and modified illumination method which are being studied at present.

Examples of the apparatus where this effect is applied to the transfer of a fine image pattern of a semiconductor device are described in JP-A-57-153433 (the term "JP-A" as used herein means an "unexamined published Japanese patent application").

Recent progress of the immersion exposure technique is reported, for example, in SPIE Proc., 4688, 11 (2002), J. Vac. Sci. Tecnol. B, 17 (1999) and SPIE Proc., 3999, 2 (2000). In the case of using an ArF excimer laser as the light source, in view of safety on handling as well as transmittance and refractive index at 193 nm, pure water (refractive index at 193 nm: 1.44) is considered to be a most promising immersion liquid. In the case of using an $F_2$ excimer laser as the light source, a fluorine-containing solution is being studied in the light of balance between transmittance and refractive index at 157 nm, but those satisfied in view of environmental safety or refractive index have been not yet found out. Considering the degree of immersion effect and the maturity of resist, the immersion exposure technique is expected to be most soon mounted on an ArF exposure machine.

Since the discovery of a resist for a KrF excimer laser (248 nm), an image forming method called chemical amplification is used as the image forming method for a resist so as to compensate the reduction in the sensitivity due to light absorption. The image forming method, for example, using positive chemical amplification is an image forming method where an acid generator in the exposed area decomposes upon exposure to generate an acid, the acid generated is used as a reaction catalyst in the baking after exposure (PEB: post exposure bake) to convert the alkali-insoluble group into an alkali-soluble group, and the exposed area is removed by an alkali developer.

A resist for an ArF excimer laser (wavelength: 193 nm) using this chemical amplification mechanism is predominating at present, and a resist composition ensuring the same performance even in the immersion exposure as that in the normal exposure (dry exposure) is demanded.

Also, it is pointed out that when the chemical amplification resist is applied to immersion exposure, the resist layer comes into contact with the immersion liquid at the exposure, as a result, the resist layer deteriorates or a component adversely affecting the immersion liquid bleeds out from the resist layer. International Publication No. WO 2004-068242, pamphlet describes a case where when the resist for ArF exposure is dipped in water before and after exposure, the resist performance is changed, and this is indicated as a problem in the immersion exposure.

Furthermore, in the immersion exposure process, when the exposure is performed by using a scanning-type immersion exposure machine, unless the immersion liquid moves following the movement of lens, the exposure speed decreases and this may affect the productivity. In the case where the immersion liquid is water, the resist film is preferably hydrophobic because of good followability of water.

On the other hand, studies are being made on a resist composition containing a fluorine atom or a silicon atom from the following various standpoints.

JP-A-2000-338676 discloses a resist composition comprising a specific resin and a fluorine-containing and/or silicon-containing surfactant, which ensures that in the image forming method by dry exposure, the sensitivity, resolving power, dry etching resistance and adhesion to substrate are excellent and the problems of development defect and scumming are overcome.

Japanese Patent No. 3,202,979 discloses a resist composition comprising a silicon-containing polymer additive and a silicon-free base polymer for enhancing the resolution and etching resistance.

Japanese Patent No. 3,672,780 discloses a resist composition comprising a (meth)acrylic acid ester unit with the ester moiety being a fluorine atom-containing group, which is a resist composition having high transparency and high sensitivity to VUV light and $F_2$ excimer laser light.

As described above, a resist for an ArF excimer laser (wavelength: 193 nm) using the chemical amplification mechanism is predominating at present, but it is requested to more enhance the performance such as profile and defocus latitude (DOF). Also, a resist composition exhibiting the same performance even when subjected to immersion exposure is demanded. The defocus latitude is a tolerance for focus fluctuation at the exposure.

SUMMARY OF THE INVENTION

An object of the present invention is to provide a positive resist composition capable of forming a good profile not only by normal exposure but also by immersion exposure and allowing wide exposure latitude (DOF), and a pattern forming method using the composition.

The present invention provides a positive resist composition having the following constructions and a pattern forming method using the composition. The above-described object of the present invention can be attained by these positive resist composition and image forming method.

(1) A positive resist composition, which comprises:

(A) a resin of which solubility in an alkali developer increases under an action of an acid;

(B) a compound capable of generating an acid upon irradiation with actinic rays or radiation;

(C) a resin having at least one of a fluorine atom and a silicon atom; and (D) a solvent, wherein the resin (C) contains at least one of: (C1) a resin having at least one of a fluorine atom and a silicon atom and having an alicyclic structure; and (C2) a resin containing a repeating unit having at least one of a fluorine atom and a silicon atom in a side chain and a repeating unit having an unsubstituted alkyl group in a side chain.

(2) The positive resist composition as described in (1) above, wherein the resin (C) is insoluble in an alkali developer.

(3) The positive resist composition as described in (1) or (2) above, wherein an amount added of the resin (C) is from 0.1 to 5.0 mass % based on the entire solid content concentration.

(4) The positive resist composition as described in any of (1) to (3) above, wherein the resin (A) is a copolymer of three components consisting of a (meth)acrylate having a lactone ring, a (meth)acrylate containing an organic group having at least one of a hydroxyl group and a cyano group, and a (meth)acrylate having an acid-decomposable group.

(5) The positive resist composition as described in any of (1) to (4) above, wherein the compound (B) has a triphenylsulfonium cation structure.

(6) The positive resist composition as described in any of (1) to (5) above, wherein the solvent (D) is a mixed solvent of two or more species including propylene glycol monomethyl ether acetate.

(7) A pattern forming method, which comprises:

forming a resist film from a positive resist composition as described in any of (1) to (6) above; and subjecting the resist film to immersion exposure and development.

DETAILED DESCRIPTION OF THE INVENTION

The present invention is described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Resin of which Solubility in an Alkali Developer Increases Under the Action of an Acid The resin for use in the resist composition of the present invention is a resin which decomposes under the action of an acid to increase the solubility in an alkali developer, and this is a resin having a group capable of decomposing under the action of an acid to produce an alkali-soluble group (hereinafter sometimes referred to as an "acid-decomposable group") in the main or side chain or both the main and side chains of the resin (sometimes referred to as an "acid-decomposable resin").

Examples of the alkali-soluble group include groups having a phenolic hydroxyl group, a carboxylic acid group, a fluorinated alcohol group, a sulfonic acid group, a sulfonamide group, a sulfonylimide group, an (alkyl-sulfonyl)(alkylcarbonyl)methylene group, an (alkyl-sulfonyl)(alkylcarbonyl)imide group, a bis(alkylcarbonyl)-methylene group, a bis (alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

Among these alkali-soluble groups, preferred are a carboxylic acid group, a fluorinated alcohol group (preferably hexafluoroisopropanol) and a sulfonic acid group.

The group capable of decomposing under the action of an acid (acid-decomposable group) is preferably a group resulting from displacement of a hydrogen atom of these alkali-soluble groups by a group which splits off by the effect of an acid.

Preferred examples of the acid-decomposable group include a cumyl ester group, an enol ester group, an acetal ester group and a tertiary alkyl ester group, with a tertiary alkyl ester group being more preferred.

The acid-decomposable resin is preferably an acid-decomposable resin having a monocyclic or polycyclic alicyclic hydrocarbon structure containing at least one repeating unit selected from the group consisting of a repeating unit having an alicyclic hydrocarbon-containing partial structure represented by any one of the following formulae (pI) to (pV), and a repeating unit represented by the following formula (II-AB):

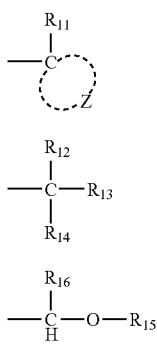 (pI)

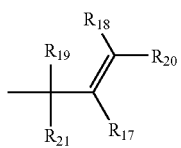 (pII)

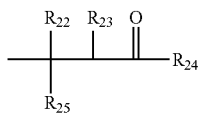 (pIII)

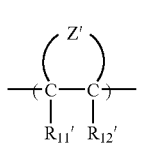 (pIV)

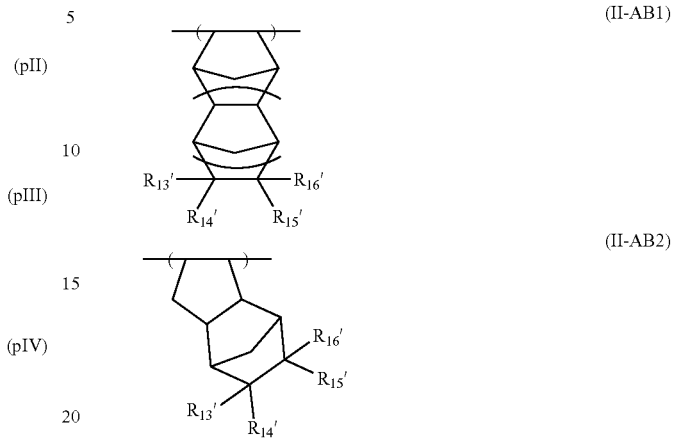

(pV)

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

$R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

$R_{17}$ to $R_{21}$ each independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

$R_{22}$ to $R_{25}$ each independently represents a hydrogen atom, a linear or branched alkyl group having a carbon number of 1 to 4 or a cycloalkyl group, provided that at least one of $R_{22}$ to $R_{25}$ represents a cycloalkyl group. $R_{23}$ and $R_{24}$ may combine with each other to form a ring.

(II-AB)

In formula (II-AB), $R_{11}'$ and $R_{12}'$ each independently represents a hydrogen atom, a cyano group, a halogen atom or an alkyl group.

Z' represents an atomic group for forming an alicyclic structure, containing two bonded carbon atoms (C—C).

Formula (II-AB) is preferably the following formula (II-AB1) or (II-AB2):

(II-AB1)

(II-AB2)

In formulae (II-AB1) and (II-AB2), $R_{13}'$ to $R_{16}'$ each independently represents a hydrogen atom, a halogen atom, a cyano group, —COOH, —COOR$_5$, a group capable of decomposing under the action of an acid, —C(=O)—X-A'—R$_{17}$', an alkyl group or a cycloalkyl group.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

At least two members out of $R_{13}'$ to $R_{16}'$ may combine to form a ring n represents 0 or 1.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

In formulae (pI) to (pV), the alkyl group of $R_{12}$ to $R_{25}$ indicates a linear or branched alkyl group having a carbon number of 1 to 4.

The cycloalkyl group of $R_{11}$ to $R_{25}$ and the cycloalkyl group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

These alkyl group and cycloalkyl group may further have a substituent, and examples of the substituent which this alkyl or cycloalkyl group may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like may further have include a hydroxyl group, a halogen atom and an alkoxy group.

The structures represented by formulae (pI) to (pV) each can be used for the protection of an alkali-soluble group in the resin.

The repeating unit having an alkali-soluble group protected by the structure represented by any one of formulae (pI) to (pV) is preferably a repeating unit represented by the following formula (pA):

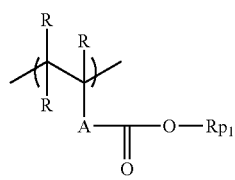

(pA)

In formula (pA), R represents a hydrogen atom, a halogen atom or a linear or branched alkyl group having a carbon number of 1 to 4, and a plurality of R's may be the same or different.

A represents a single bond, or a sole group or a combination of two or more groups, selected from the group consisting of an alkylene group, an ether group, a thioether group, a carbonyl group, an ester group, an amido group, a sulfonamido group, a urethane group and a urea group. A is preferably a single bond.

$Rp_1$ represents any one group of formulae (pI) to (pV).

The repeating unit represented by formula (pA) is most preferably a repeating unit comprising a 2-alkyl-2-adamantyl (meth)acrylate or a dialkyl(1-adamantyl)methyl (meth)acrylate.

Specific examples of the repeating unit represented by formula (pA) are set forth below.

(In the formulae, Rx represents H, $CH_3$, $CF_3$ or $CH_2OH$, and Rxa and Rxa each represents an alkyl group having a carbon number of 1 to 4.)

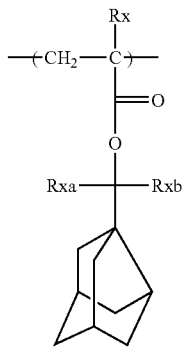

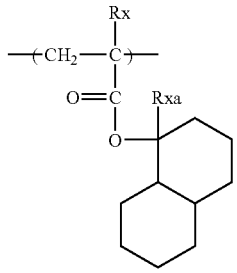

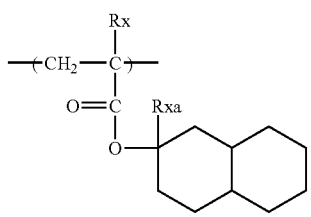

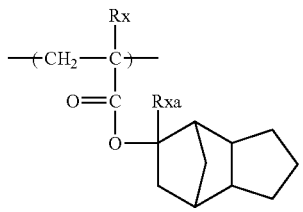

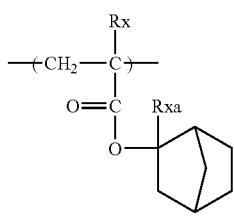

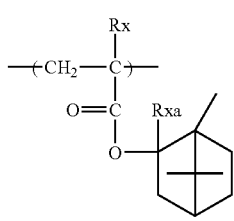

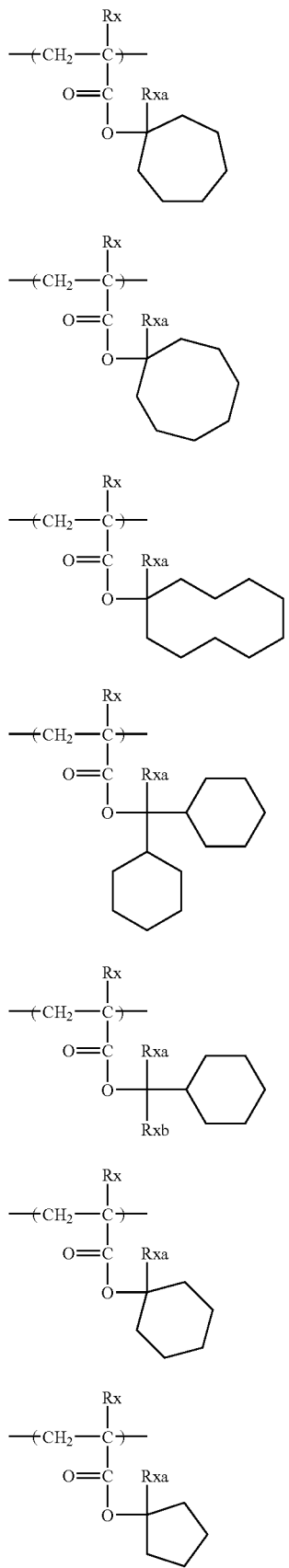
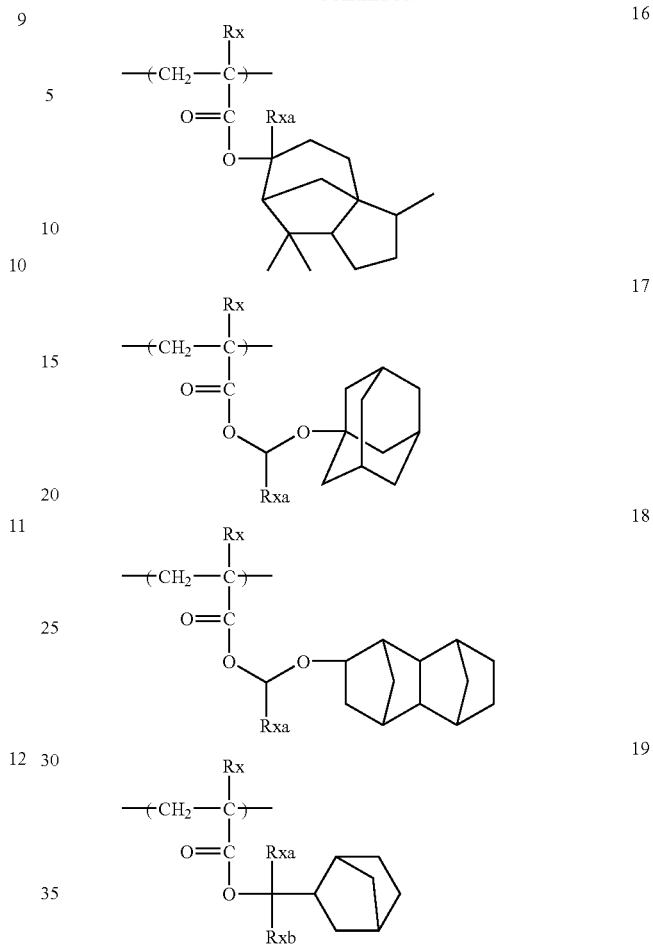

Examples of the halogen atom of $R_{11}'$ and $R_{12}'$ include a chlorine atom, a bromine atom, a fluorine atom and an iodine atom.

The alkyl group of $R_{11}'$ and $R_{12}'$ includes a linear or branched alkyl group having a carbon number of 1 to 10.

The atomic group of Z' for forming an alicyclic structure is an atomic group for forming, in the resin, an alicyclic hydrocarbon repeating unit which may have a substituent. In particular, an atomic group for forming a crosslinked alicyclic structure to form a crosslinked alicyclic hydrocarbon repeating unit is preferred.

Examples of the skeleton of the alicyclic hydrocarbon formed are the same as those of the alicyclic hydrocarbon group of $R_{11}$ to $R_{25}$ in formulae (pI) to (pVI).

The alicyclic hydrocarbon skeleton may have a substituent, and examples of the substituent include $R_{13}'$ to $R_{16}'$ in formulae (II-AB1) and (II-AB2).

In the acid-decomposable resin for use in the present invention, the group capable of decomposing under the action of an acid may be contained in at least one repeating unit out of the repeating unit having an alicyclic hydrocarbon-containing partial structure represented by any one of formulae (pI) to (pV), the repeating unit represented by formula (II-AB), and the repeating unit comprising a copolymerization component described later.

Various substituents $R_{13}'$ to $R_{16}'$ in formulae (II-AB1) and (II-AB2) may work out to a substituent of an atomic group for forming an alicyclic structure in formula (II-AB) or an atomic group Z for forming a crosslinked alicyclic structure.

Specific examples of the repeating units represented by formulae (II-AB1) and (II-AB2) are set forth below, but the present invention is not limited thereto.
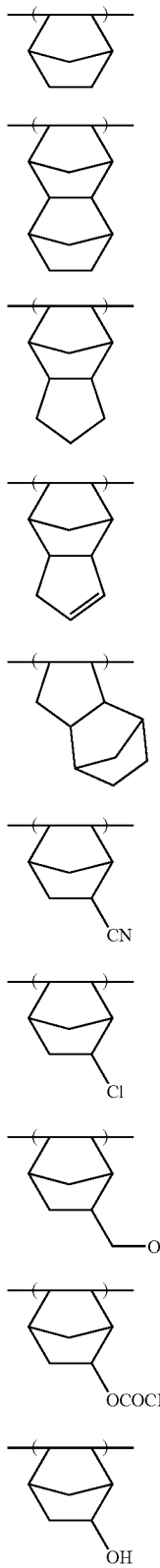
[II-1]
[II-2]
[II-3]
[II-4]
[II-5]
[II-6]
[II-7]
[II-8]
[II-9]
[II-10]
-continued
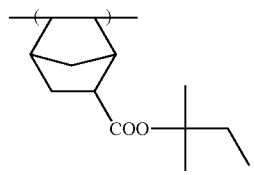
[II-11]
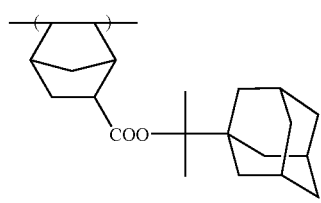
[II-12]
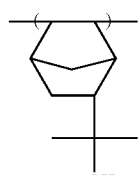
[II-13]
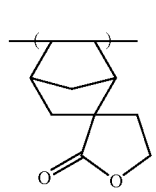
[II-14]
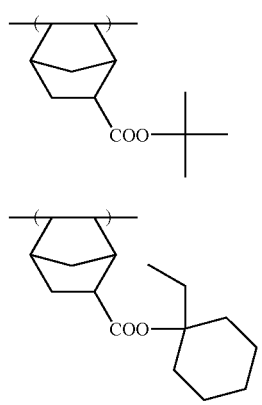
[II-15]
[II-16]
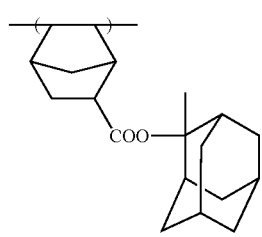
[II-17]
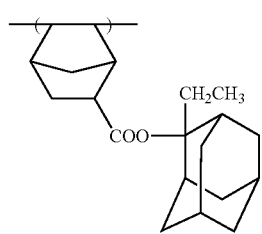
[II-18]

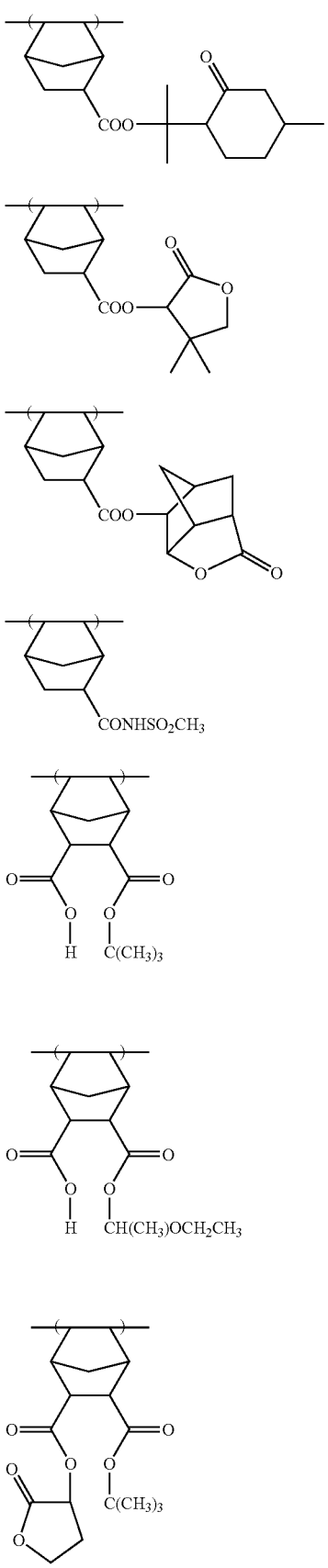
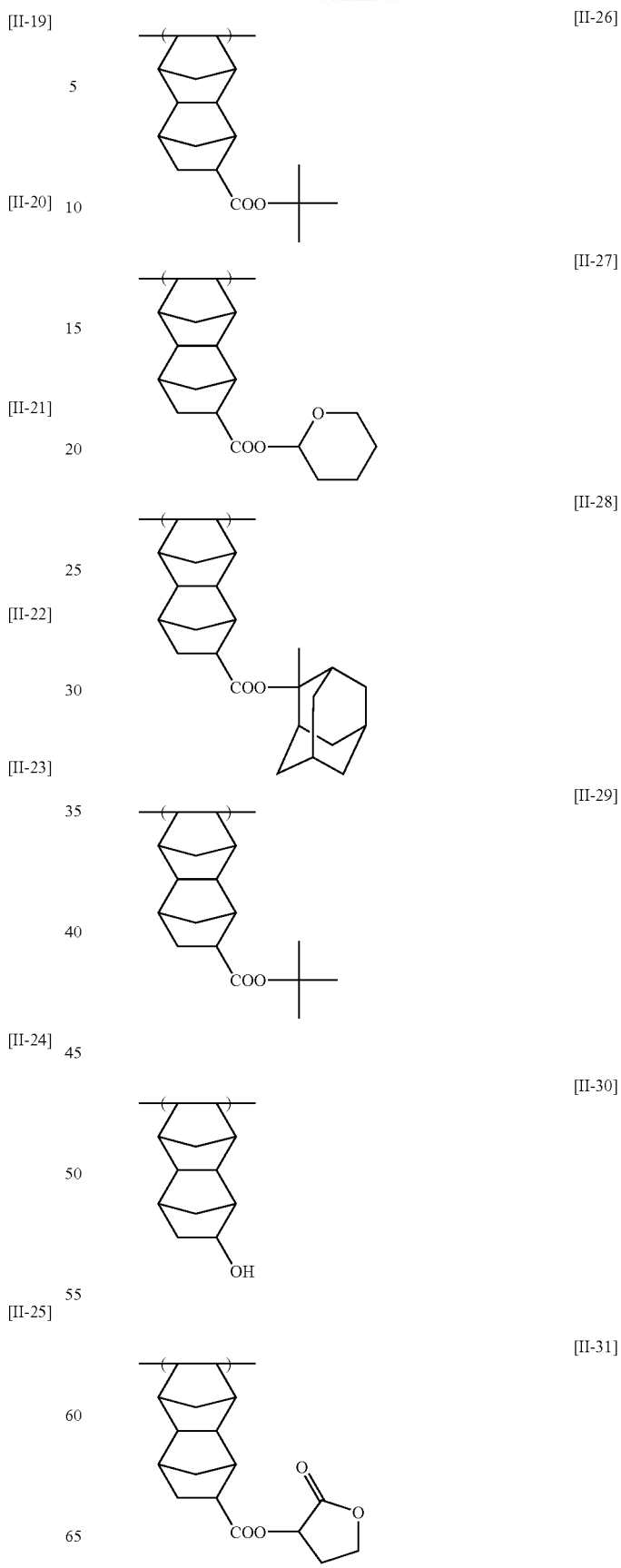

[II-32]

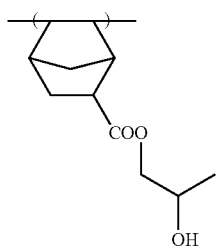

<Repeating Unit Having Lactone Ring>

The acid-decomposable resin preferably has a lactone ring. As for the group having a lactone ring, any group may be used as long as it has a lactone ring, but a group having a 5- to 7-membered ring lactone structure is preferred. The 5- to 7-membered ring lactone structure is preferably condensed with another ring structure in the form of forming a bicyclo or spiro structure. A group having a lactone structure represented by any one of the following formulae (LC1-1) to (LC1-16) is more preferred. The group having a lactone structure may be bonded directly to the main chain. Among these lactone structures, (LC1-1), (LC1-4), (LC1-5), (LC1-6), (LC1-13) and (LC1-14) are preferred. By virtue of using a lactone structure, the line edge roughness and the development defect are improved.

LC1-1

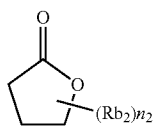

LC1-2

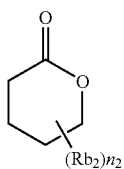

LC1-3

LC1-4

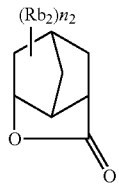

LC1-5

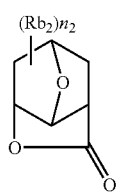

LC1-6

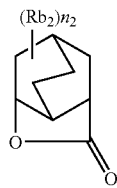

LC1-7

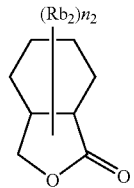

LC1-8

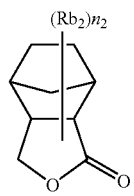

LC1-9

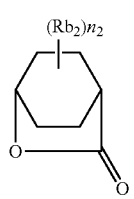

LC1-10

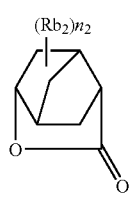

LC1-11

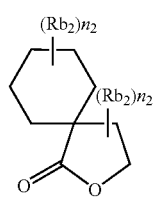

LC1-12

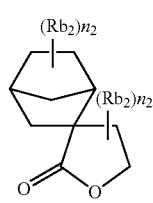

LC1-13

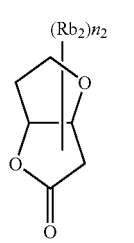

-continued

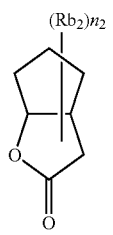
LC1-14

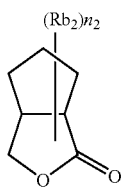
LC1-15

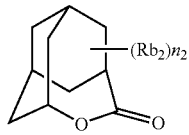
LC1-16

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, the plurality of $Rb_2$'s may be the same or different and also, the plurality of $Rb_2$'s may combine with each other to form a ring.

Examples of the repeating unit containing a group having a lactone structure represented by any one of formulae (LC1-1) to (LC1-13) include a repeating unit where at least one of $R_{13}'$ to $R_{16}'$ in formula (II-AB1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

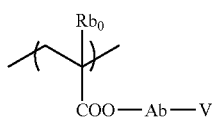

(AI)

In formula (AI), $Rb_0$ represents a hydrogen atom, a halogen atom or an alkyl group having a carbon number of 1 to 4. Examples of the substituent which the alkyl group of $Rb_0$ may have include a hydroxyl group and a halogen atom.

Examples of the halogen atom of $Rb_0$ include a fluorine atom, a chlorine atom, a bromine atom and an iodine atom. $Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, preferably a single bond or a linking group represented by -$Ab_1$-$CO_2$—.

$Ab_1$ is a linear or branched alkylene group or a monocyclic or polycyclic cycloalkylene group, preferably a methylene group, an ethylene group, a cyclohexyl group, an adamantyl group or a norbornyl group.

V represents a group represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit containing a group having a lactone structure are set forth below, but the present invention is not limited thereto.

(In the formulae, Rx is H, $CH_3$, $CH_2OH$ or $CF_3$.)

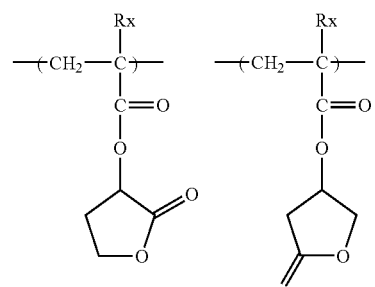

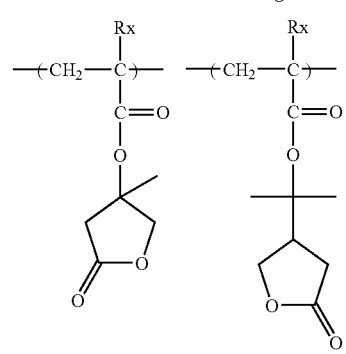

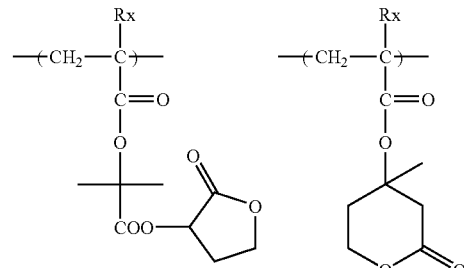

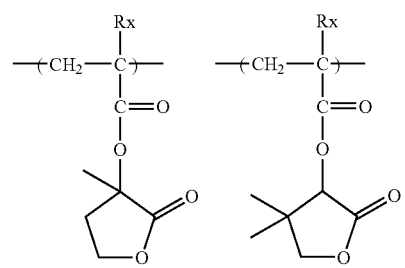

-continued
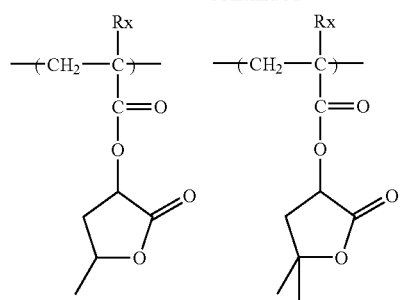
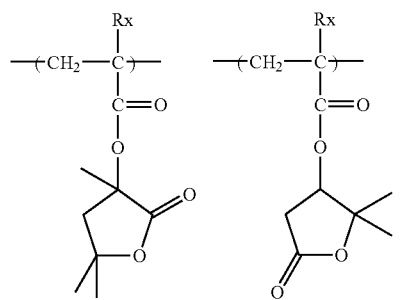
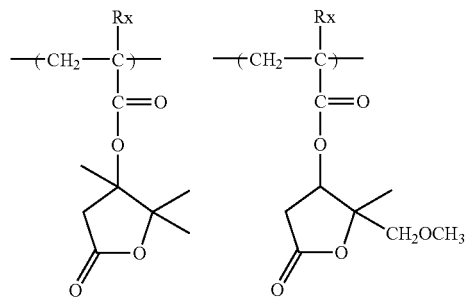
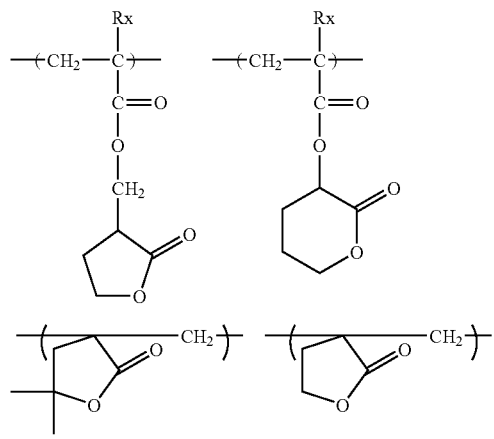
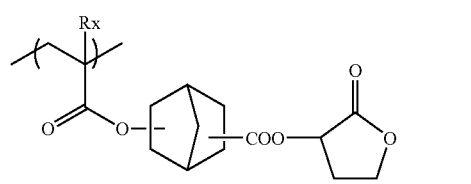
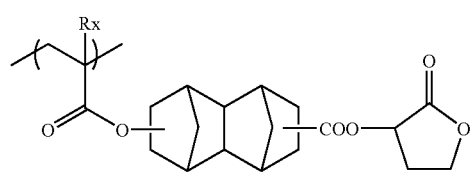
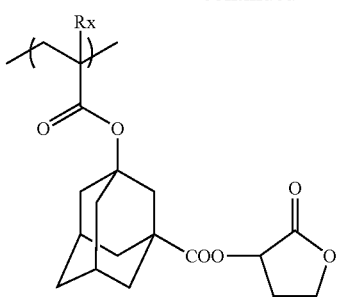
(In the formulae, Rx is H, CH$_3$, CH$_2$OH or CF$_3$.)
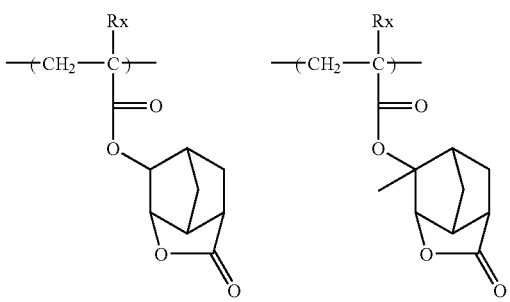
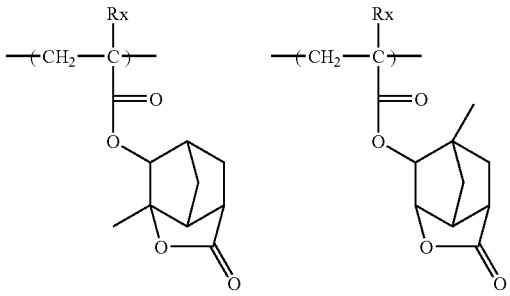
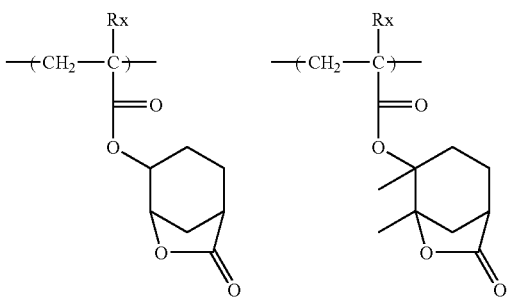
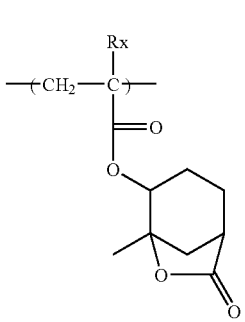

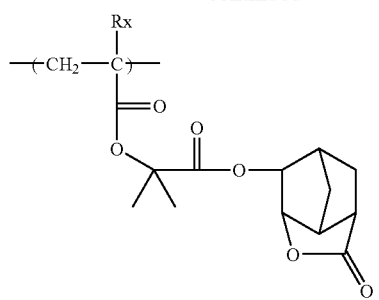
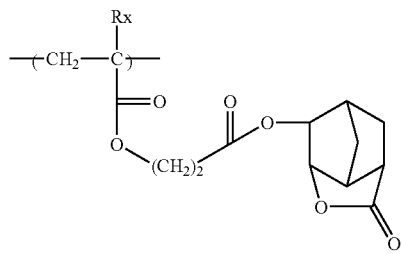
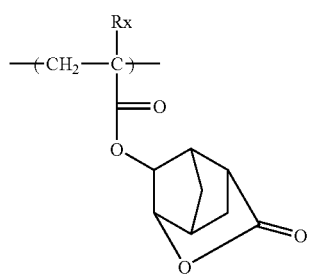
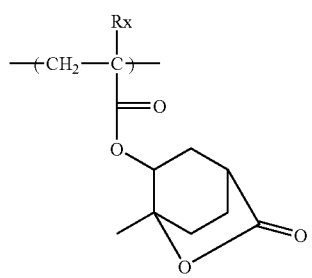
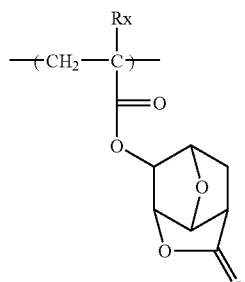
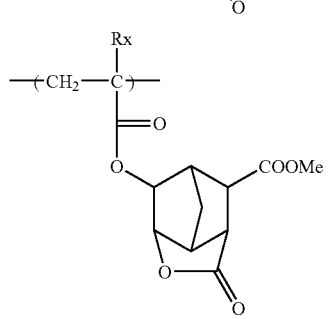
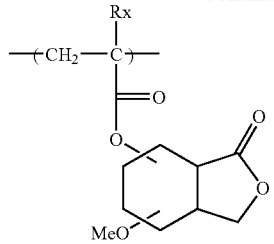
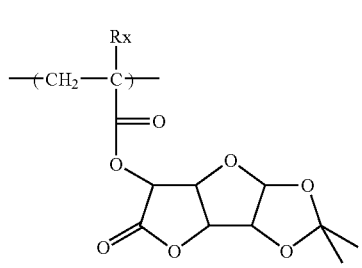
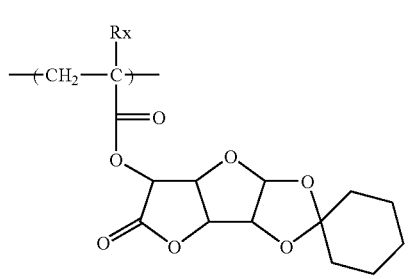
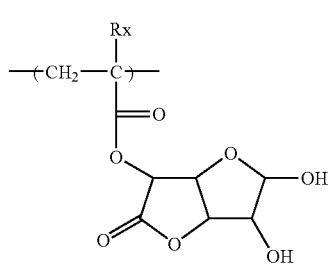
(In the formulae, Rx is H, CH$_3$, CH$_2$OH or CF$_3$.)
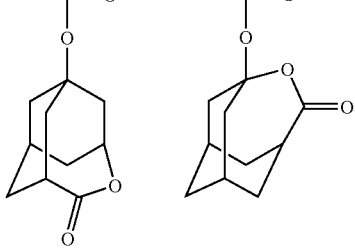

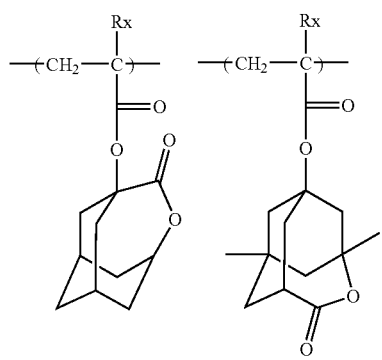
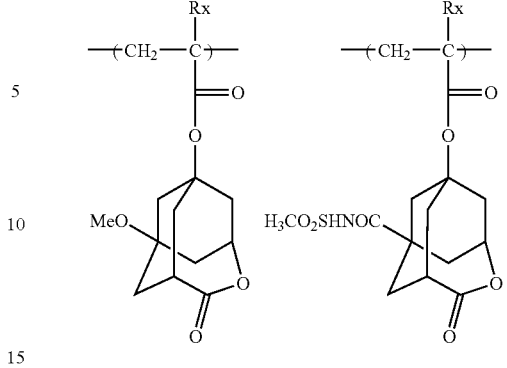

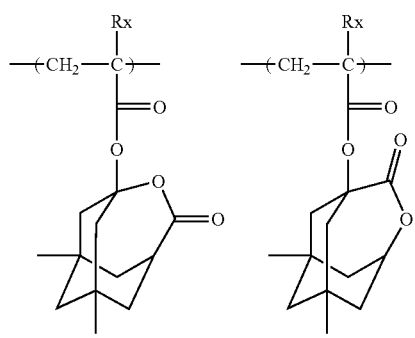

Repeating Unit Having Polar Group

The acid-decomposable resin for use in the present invention preferably contains an organic group having a polar group, more preferably an alicyclic hydrocarbon structure substituted by a polar group. By virtue of this structure, the adhesion to substrate and the affinity for developer are enhanced. The polar group is preferably a hydroxyl group or a cyano group.

Preferred examples of the organic group substituted by a polar group include the structures represented by formulae (VIIa) and (VIIb):

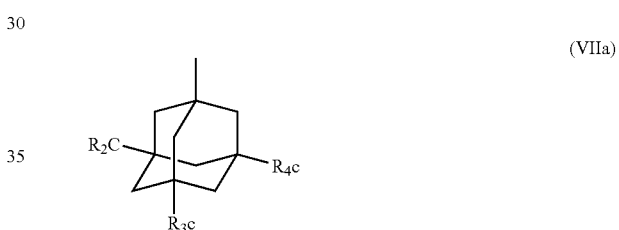

(VIIa)

(VIIb)

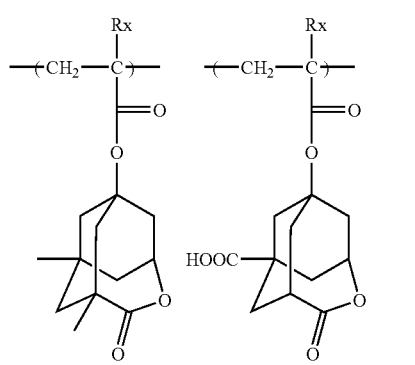

In formula (VIIa), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two member(s) out of $R_{2c}$ to $R_{4c}$ is(are) a hydroxyl group with the remaining being a hydrogen atom is preferred, and a structure where two members out of $R_{2c}$ to $R_{4c}$ are a hydroxyl group with the remaining being a hydrogen atom is more preferred.

The group represented by formula (VIIa) or (VIIb) is preferably a dihydroxy form or a monohydroxy form, more preferably a dihydroxy form.

Examples of the repeating unit having a group represented by formula (VIIa) or (VIIb) include a repeating unit where at least one of $R_{13}'$ to $R_{16}'$ in formula (II-A) or (II-B) has a group represented by formula (VIIa) or (VIIb) (for example, $R_5$ of —COOR$_5$ is a group represented by formula (VIIa) or (VIIb)), and repeating units represented by the following formulae (AII):

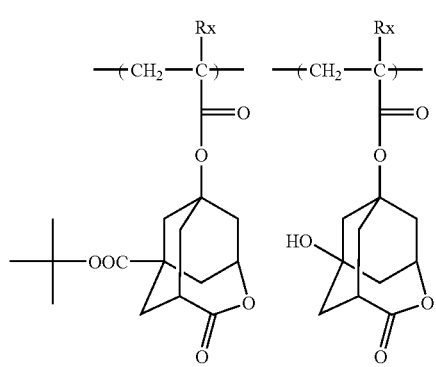

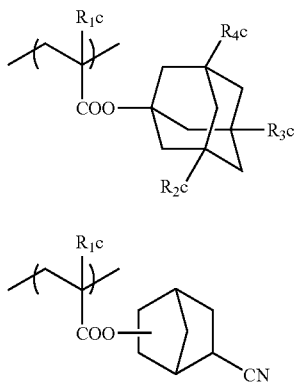

In formulae (AIIa) and (AIIb), each $R_{1c}$ independently represents a hydrogen atom, a methyl group, a trifluoromethyl group or a hydroxymethyl group.

Specific examples of the repeating unit having a structure represented by formula (AIIa) or (AIIb) are set forth below, but the present invention is not limited thereto.

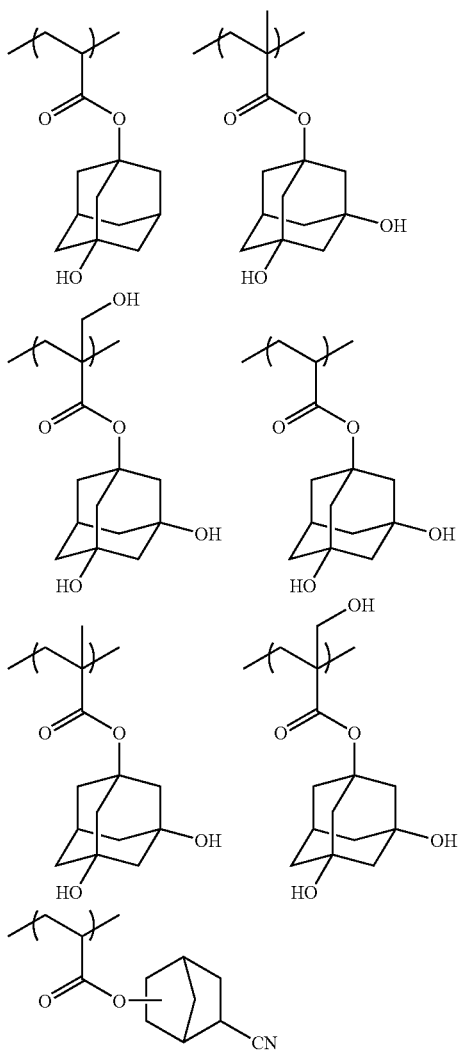

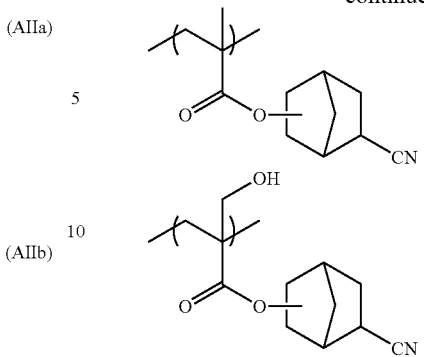

The acid-decomposable resin for use in the present invention may contain a repeating unit represented by the following formula (VIII):

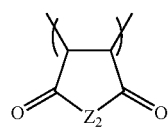

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

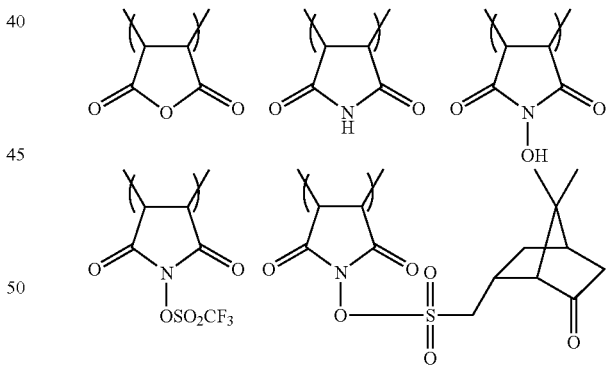

The acid-decomposable resin for use in the present invention preferably contains a repeating unit having an alkali-soluble group, more preferably a repeating unit having a carboxyl group. By virtue of containing such a repeating unit, the resolution increases in the usage of forming contact holes. As for the repeating unit having a carboxyl group, both a repeating unit where a carboxyl group is directly bonded to the resin main chain, such as repeating unit by an acrylic acid or a methacrylic acid, and a repeating unit where a carboxyl group is bonded to the resin main chain through a linking group, are preferred. The linking group may have a monocyclic or polycyclic hydrocarbon structure. An acrylic acid and a methacrylic acid are most preferred.

The acid-decomposable resin for use in the present invention may further contain a repeating unit having from 1 to 3 groups represented by formula (F1). By virtue of this repeating unit, the line edge roughness performance is enhanced.

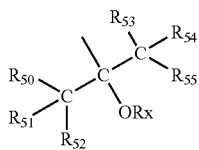
(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom. Rx represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group. It is preferred that $R_{50}$ to $R_{55}$ all are a fluorine atom.

The organic group represented by Rx is preferably an acid-decomposable protective group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

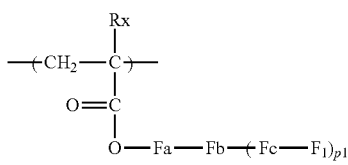
(F2)

In the formula, Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group, preferably a single bond.

Fb represents a monocyclic or polycyclic hydrocarbon group.

Fc represents a single bond or a linear or branched alkylene group, preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a structure of formula (F1) are set forth below.

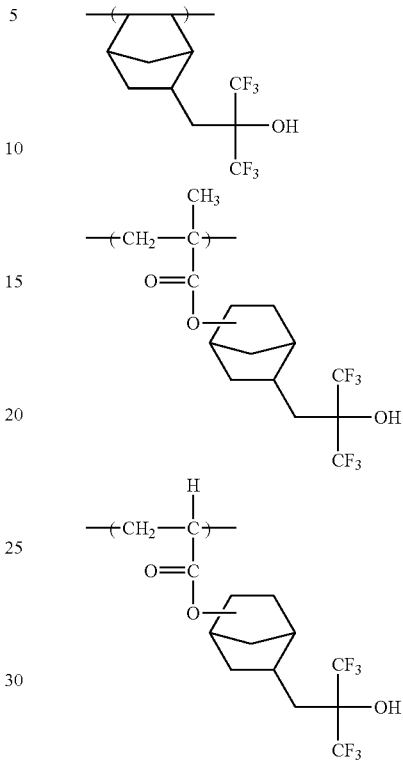

The acid-decomposable resin for use in the present invention may contain, in addition to the above-described repeating units, various repeating structural units for the purpose of controlling dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the acid-decomposable resin, particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

The preferred embodiment of the acid-decomposable resin for use in the present invention includes the followings:

(1) a resin containing a repeating unit having an alicyclic hydrocarbon-containing partial structure represented by any one of formulae (pI) to (pV) (side chain type), preferably containing a (meth)acrylate repeating unit having a structure represented by any one of formulae (pI) to (pV), and (2) a resin containing a repeating unit represented by formula (II-AB) (main chain type).

The embodiment of (2) further includes:

(3) a resin having a repeating unit represented by formula (II-AB), a maleic anhydride derivative and a (meth)acrylate structure (hybrid type).

In the acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the acid-decomposable resin, the content of the repeating unit having an alicyclic hydrocarbon-containing partial structure represented by any one of formulae (pI) to (pV) is preferably from 10 to 70 mol %, more preferably from 20 to 60 mol %, still more preferably from 25 to 40 mol %, based on all repeating structural units.

In the acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

In the acid-decomposable resin, the content of the repeating unit having a lactone ring is preferably from 10 to 70 mol %, more preferably from 20 to 60 mol %, still more preferably from 25 to 40 mol %, based on all repeating structural units.

In the acid-decomposable resin, the content of the repeating unit containing an organic group having a polar group is preferably from 1 to 40 mol %, more preferably from 5 to 30 mol %, still more preferably from 5 to 20 mol %, based on all repeating structural units.

The acid-decomposable group is preferably a copolymer of three components consisting of a (meth)acrylate having a lactone ring, a (meth)acrylate containing an organic group having at least either a hydroxyl group or a cyano group, and a (meth)acrylate having an acid-decomposable group.

The content of the repeating structural unit based on the above-described monomer as the further copolymerization component, in the resin, can also be appropriately selected according to the desired resist performance but in general, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

In the case of using the composition of the present invention for exposure with ArF, the resin preferably has no aromatic group in view of transparency to ArF light.

The alicyclic hydrocarbon-based acid-decomposable resin for use in the present invention is preferably a resin where all repeating units comprise a (meth)acrylate repeating unit. In this case, the repeating units may be all a methacrylate, all an acrylate, or a mixture of methacrylate/acrylate, but the content of the acrylate repeating unit is preferably 50 mol % or less based on all repeating units. The acid-decomposable resin is more preferably a ternary copolymerization polymer comprising from 25 to 50% of the repeating unit having an alicyclic hydrocarbon-containing partial structure represented by any one of formulae (pI) to (pV), from 25 to 50% of the repeating unit having a lactone structure and from 5 to 30% of the repeating unit having an alicyclic hydrocarbon structure substituted by a polar group, or a quaternary copolymerization polymer additionally comprising from 5 to 20% of the repeating unit represented by formula (F1).

The weight average molecular weight of the polymer or copolymer for use in the present invention is preferably from 1,500 to 100,000, more preferably from 2,000 to 70,000, still more preferably from 3,000 to 50,000.

The acid-decomposable resin for use in the present invention can be synthesized by an ordinary method (for example, radical polymerization). Examples of the synthesis method in general include a batch polymerization method of dissolving the monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent capable of dissolving the composition of the present invention, such as propylene glycol monomethyl ether acetate, propylene glycol monomethyl ether and cyclohexanone, which is described later. The polymerization is preferably performed by using the same solvent as the solvent used in the resist composition of the present invention. By the use of this solvent, production of particles during storage can be suppressed.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 50 to 100° C. (In this specification, mass ratio is equal to weight ratio.)

In the present invention, the amount of the resin (A) added in the photosensitive composition is from 50 to 99.7%, preferably from 70 to 99.5%, based on the entire solid content. Other than the above-described resin for use in the present invention, other resins may also be used, if desired. In the composition of the present invention, the other resin may be mixed at a ratio of preferably 70 parts by mass or less, more preferably 50 parts by mass or less, per 100 parts by mass of the resin (A) for use in the present invention.

(B) Compound Capable of Generating an Acid Upon Irradiation with Actinic Rays or Radiation (Photoacid Generator)

The photosensitive composition of the present invention comprises a compound capable of generating an acid upon irradiation with actinic rays or radiation (component B).

The photoacid generator may be appropriately selected from a photoinitiator for photocationic polymerization, a photoinitiator for photoradical polymerization, a photo-decoloring agent for coloring matters, a photo-discoloring agent, a known compound used for microresist or the like and capable of generating an acid upon irradiation with actinic rays or radiation, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Among the compounds capable of generating an acid upon irradiation with actinic rays or radiation, preferred are the compounds represented by the following formulae (ZI), (ZII) and (ZIII):

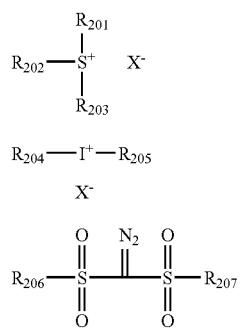

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes the organic anions represented by the following formulae:

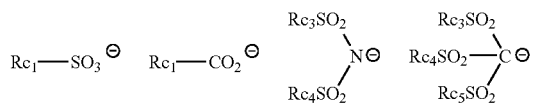

In the formulae, $Rc_1$ represents an organic group.

The organic group of $Rc_1$ includes an organic group having a carbon number of 1 to 30, and preferred examples thereof include an alkyl group which may be substituted, an aryl group, and a group where a plurality of such groups are connected through a single bond or a linking group such as —O—, —CO$_2$—, —S—, —SO$_3$— and —SO$_2$N(Rd$_1$)—. Rd$_1$ represents a hydrogen atom or an alkyl group.

$Rc_3$, $Rc_4$ and $Rc_5$ each represents an organic group. Preferred organic groups of $Rc_3$, $Rc_4$ and $Rc_5$ are the same as the preferred organic groups in $Rb_1$. The organic group is most preferably a perfluoroalkyl group having a carbon number of 1 to 4.

$Rc_3$ and $Rc_4$ may combine to form a ring.

The group formed after $Rc_3$ and $Rc_4$ are combined includes an alkylene group and an arylene group, and a perfluoroalkylene group having a carbon number of 2 to 4 is preferred.

The organic group of $Rc_1$ and $Rc_3$ to $Rc_5$ is most preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon irradiation with light increases and the sensitivity is enhanced. Also, when $Rc_3$ and $Rc_4$ are combined to form a ring, the acidity of the acid generated upon irradiation with light increases and the sensitivity is enhanced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed after two members out of $R_{201}$ to $R_{203}$ are combined include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group.

Examples of the arylsulfonium compound include a triarylsulfonium compound, a diarylalkylsulfonium compound and an aryldialkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same of different.

The alkyl group which is present, if desired, in the arylsulfonium compound is preferably a linear, branched or cyclic alkyl group having a carbon number of 1 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group and alkyl group of $R_{201}$ to $R_{203}$ each may have, as the substituent, an alkyl group (for example, an alkyl group having a carbon number of 1 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear, branched or cyclic alkyl group having a carbon number of 1 to 12, or a linear, branched or cyclic alkoxy group having a carbon number of 1 to 12, and most preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, and most preferably a linear or branched 2-oxoalkyl group.

The alkyl group as $R_{201}$ to $R_{203}$ may be either linear, branched or cyclic and preferably includes a linear or branched alkyl group having a carbon number of 1 to 10 (e.g., methyl, ethyl, propyl, butyl, pentyl), and a cyclic alkyl group having a carbon number of 3 to 10 (e.g., cyclopentyl, cyclohexyl, norbornyl).

The 2-oxoalkyl group as $R_{201}$ to $R_{203}$ may be linear, branched or cyclic and preferably includes a group having >C=O at the 2-position of the above-described alkyl group.

The alkoxy group in the alkoxycarbonylmethyl group as $R_{201}$ to $R_{203}$ preferably includes an alkoxy group having a carbon number of 1 to 5 (e.g., methyl, ethyl, propyl, butyl, pentyl).

$R_{201}$ to $R_{203}$ each may be further substituted by a halogen atom, an alkoxy group (for example, an alkoxy group having a carbon number of 1 to 5), a hydroxyl group, a cyano group or a nitro group.

Two members out of $R_{201}$ to $R_{203}$ may combine to form a ring structure, and the ring may contain an oxygen atom, a sulfur atom, an ester bond, an amide bond or a carbonyl group. Examples of the group formed after two members out of $R_{201}$ to $R_{203}$ are combined include an alkylene group (e.g., butylene, pentylene).

The compound (ZI-3) is a compound represented by the following formula (ZI-3), and this is a compound having a phenacylsulfonium salt structure.

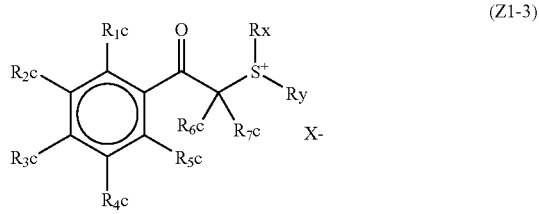

(ZI-3)

$R_{1c}$ to $R_{5c}$ each independently represents a hydrogen atom, an alkyl group, an alkoxy group or a halogen atom.

$R_{6c}$ and $R_{7c}$ each represents a hydrogen atom or an alkyl group.

$R_x$ and $R_y$ each independently represents an alkyl group, a 2-oxoalkyl group, an alkoxycarbonylmethyl group, an allyl group or a vinyl group.

Any two or more members out of $R_{1c}$ to $R_{5c}$ or a pair of $R_x$ and $R_y$ may combine with each other to form a ring structure. The ring structure may contain an oxygen atom, a sulfur atom, an ester bond or an amide bond.

The alkyl group as $R_{1c}$ to $R_{5c}$ may be linear, branched or cyclic and includes, for example, an alkyl group having a carbon number of 1 to 20, preferably a linear or branched alkyl group having a carbon number of 1 to 12 (for example, a methyl group, an ethyl group, a linear or branched propyl group, a linear or branched butyl group, and a linear or branched pentyl group), and a cyclic alkyl group having a carbon number of 3 to 8 (e.g., cyclopentyl, cyclohexyl).

The alkoxy group as $R_{1c}$ to $R_{5c}$ may be linear, branched or cyclic and includes, for example, an alkoxy group having a carbon number of 1 to 10, preferably a linear or branched alkoxy group having a carbon number of 1 to 5 (for example, a methoxy group, an ethoxy group, a linear or branched propoxy group, a linear or branched butoxy group, and a linear or branched pentoxy group), and a cyclic alkoxy group having a carbon number of 3 to 8 (e.g., cyclopentyloxy, cyclohexyloxy).

A compound where any one of $R_{1c}$ to $R_{5c}$ is a linear, branched or cyclic alkyl group or a linear, branched or cyclic alkoxy group is preferred, and a compound where the sum of carbon numbers of $R_{1c}$ to $R_{5c}$ is from 2 to 15 is more preferred. In this case, the solubility in a solvent is more enhanced, and production of particles during storage can be suppressed.

Examples of the alkyl group as $R_x$ and $R_y$ are the same as those of the alkyl group as $R_{1c}$ to $R_{5c}$.

Examples of the 2-oxoalkyl group include a group having >C=O at the 2-position of the alkyl group as $R_{1c}$ to $R_{5c}$.

Examples of the alkoxy group in the alkoxycarbonylmethyl group are the same as those of the alkoxy group as $R_{1c}$ to $R_{5c}$.

Examples of the group formed after $R_x$ and $R_y$ are combined include a butylene group and a pentylene group.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group which may have a substituent, or an alkyl group which may have a substituent.

The aryl group of $R_{204}$ to $R_{207}$ is preferably a phenyl group or a naphthyl group, more preferably a phenyl group.

The alkyl group of $R_{204}$ to $R_{207}$ may be linear or branched and preferably includes a linear or branched alkyl group having a carbon number of 1 to 10 (e.g., methyl, ethyl, propyl, butyl, pentyl), and a cyclic alkyl group having a carbon number of 3 to 10 (e.g., cyclopentyl, cyclohexyl, norbornyl).

Examples of the substituent which $R_{204}$ to $R_{207}$ each may have include an alkyl group (for example, an alkyl group having a carbon number of 1 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion, and examples thereof are the same as those of the non-nucleophilic anion of $X^-$ in formula (I).

Other preferred examples of the compound capable of decomposing under irradiation with actinic rays or radiation to generate an acid, which can be used in combination, include the compounds represented by the following formulae (ZIV), (ZV) and (ZVI):

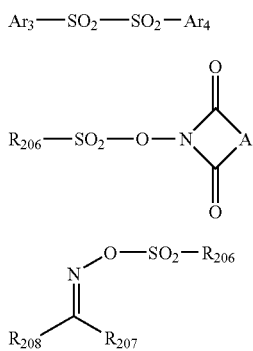

In formulae (ZIV) to (ZVI), $Ar_3$ and $Ar_4$ each independently represents a substituted or unsubstituted aryl group.

$R_{206}$ represents a substituted or unsubstituted alkyl group or a substituted or unsubstituted aryl group.

$R_{207}$ and $R_{208}$ each represents a substituted or unsubstituted alkyl group, a substituted or unsubstituted aryl group, or an electron-withdrawing group. $R_{207}$ is preferably a substituted or unsubstituted aryl group.

$R_{208}$ is preferably an electron-withdrawing group, more preferably a cyano-group or a fluoroalkyl group.

A represents a substituted or unsubstituted alkylene group, a substituted or unsubstituted alkenylene group, or a substituted or unsubstituted arylene group.

Among the compounds capable of decomposing upon irradiation with actinic rays or radiation to generate an acid, compounds represented by formulae (ZI) to (ZIII) are preferred, and a compound having a triphenylsulfonium cation structure is more preferred.

Particularly preferred examples of the compound capable of decomposing upon irradiation with actinic rays or radiation to generate an acid are set forth below.

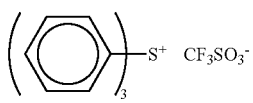
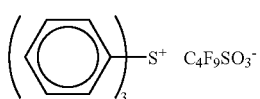
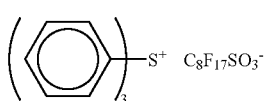
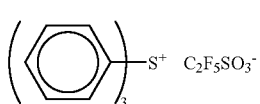
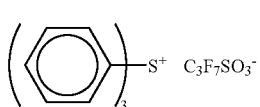
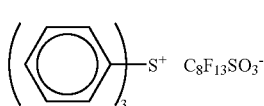
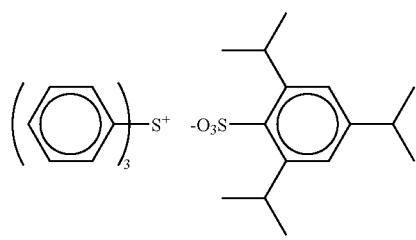
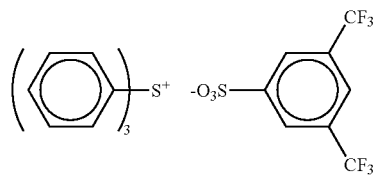
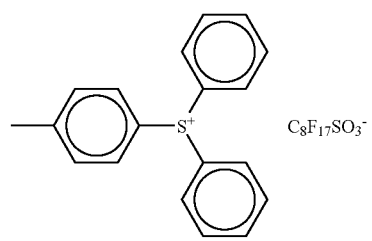
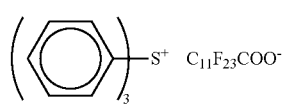
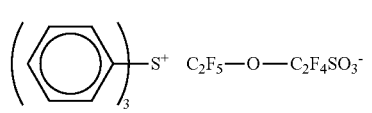
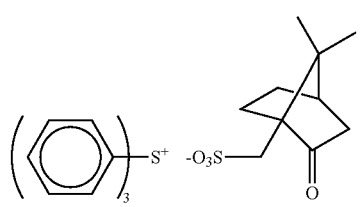
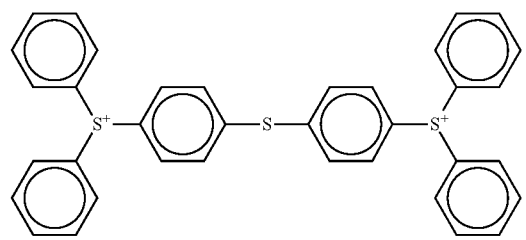
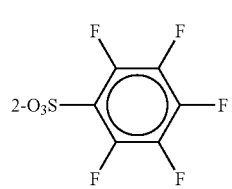

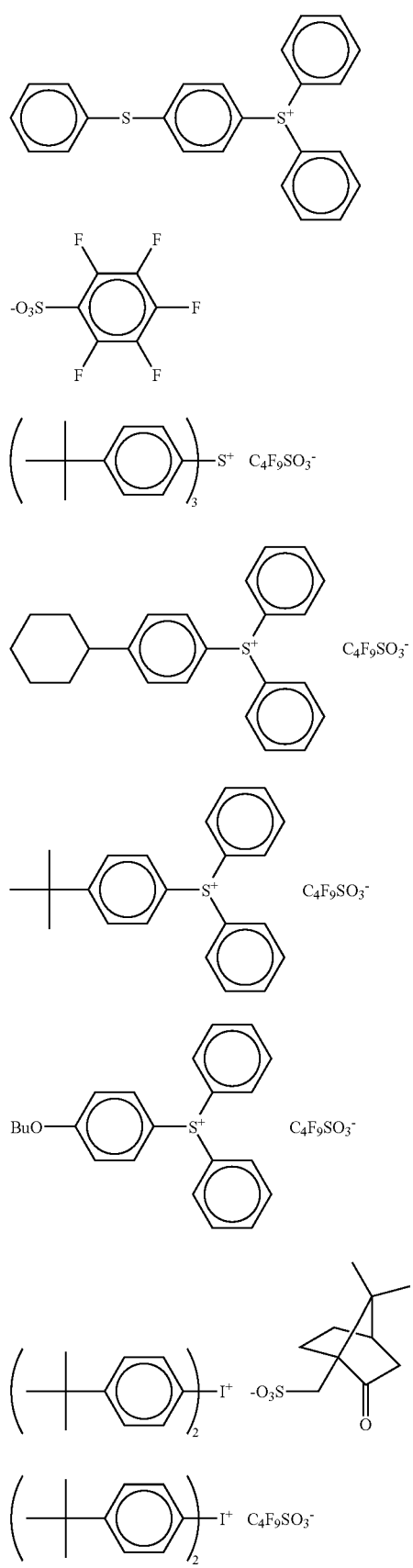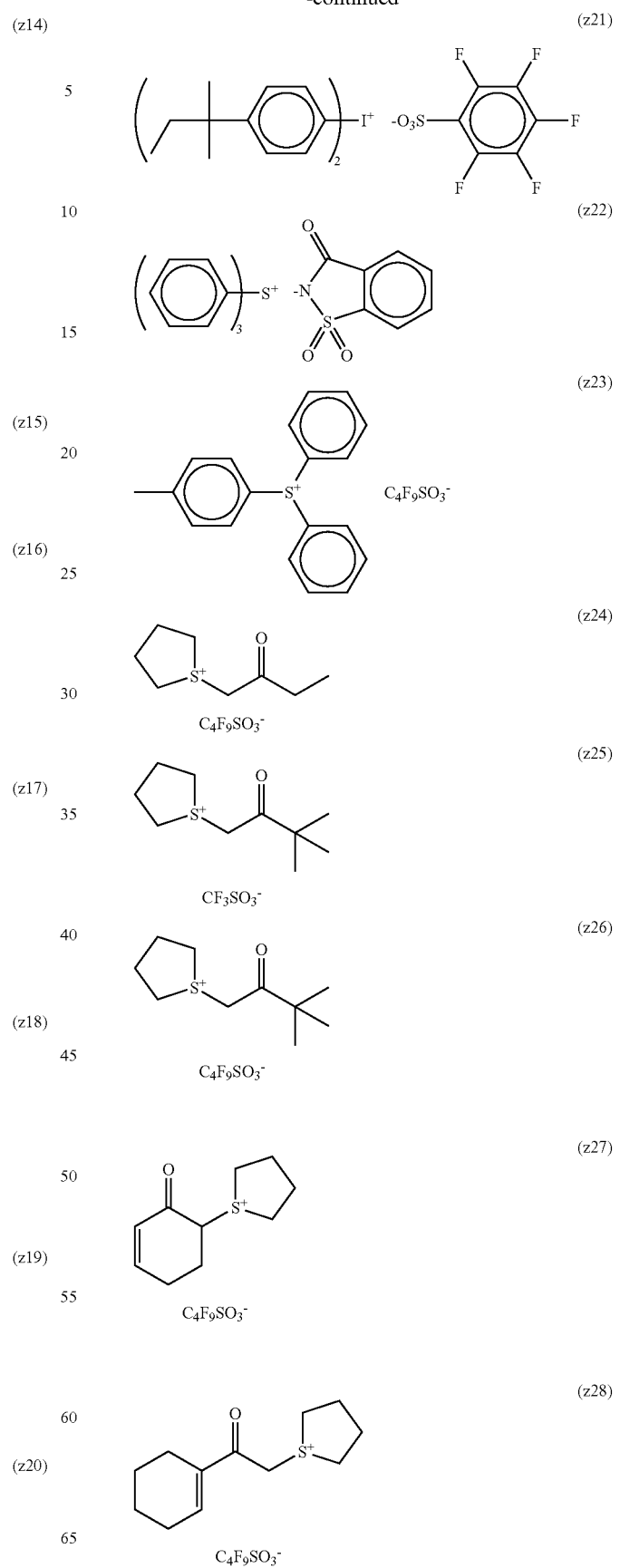

-continued
(z29) 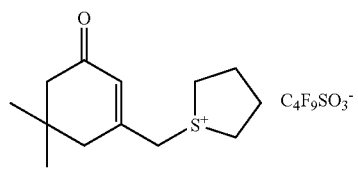
(z30) 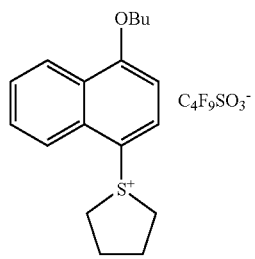
(z31) 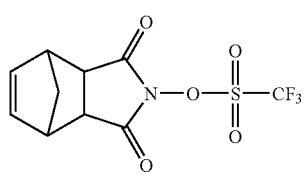
(z32) 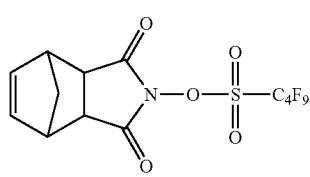
(z33) 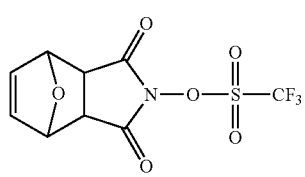
(z34) 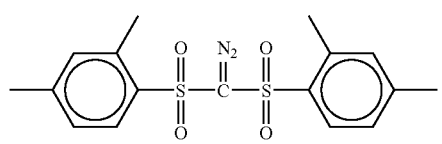
(z35) 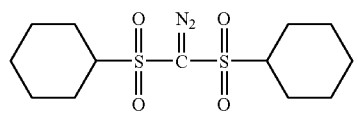
(z36) 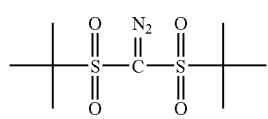
(z37) 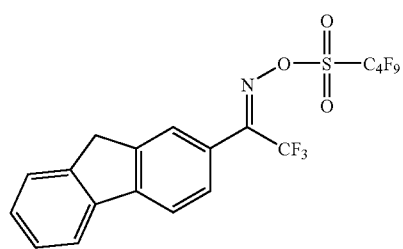
-continued
(z38) 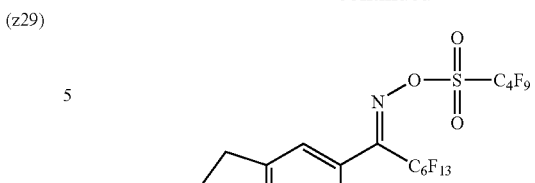
(z39) 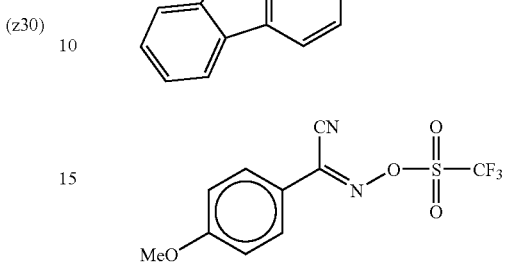
(z40) 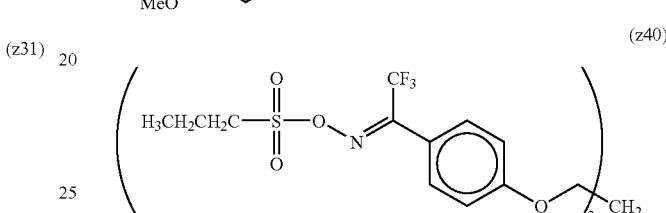
(z41) 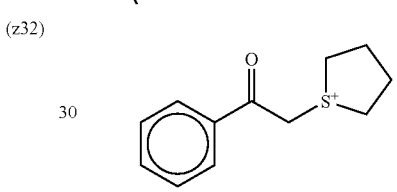
CF$_3$SO$_3^-$
(z42) 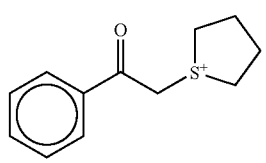
C$_4$F$_9$SO$_3^-$
(z43) 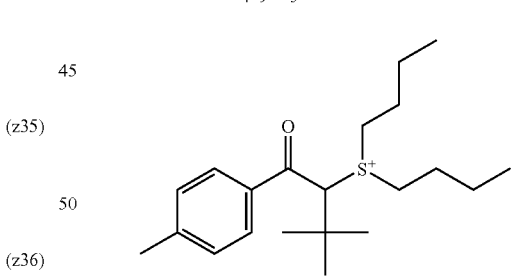
C$_4$F$_9$SO$_3^-$
(z44) 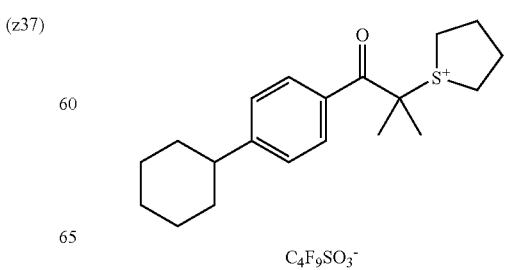
C$_4$F$_9$SO$_3^-$ -continued
(z45)
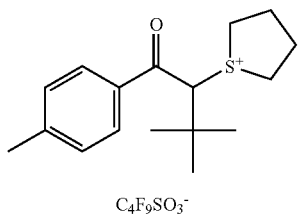
(z46)
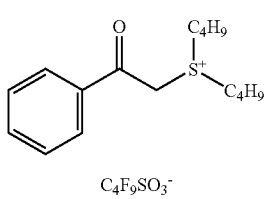
(z47)
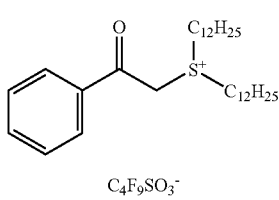
(z48)
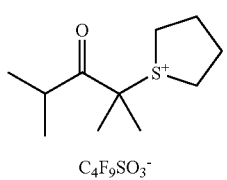
(z49)
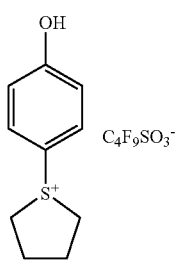
(z50)
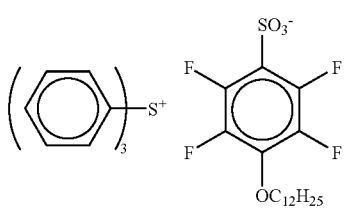
(z51)
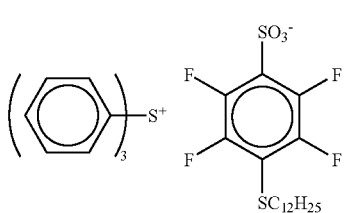
-continued
(z52)
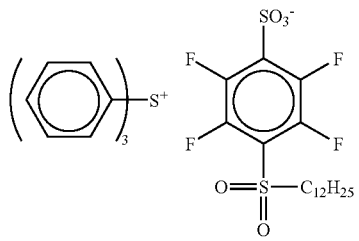
(z53)
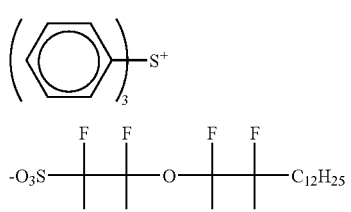
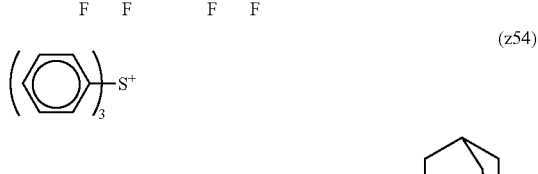
(z54)
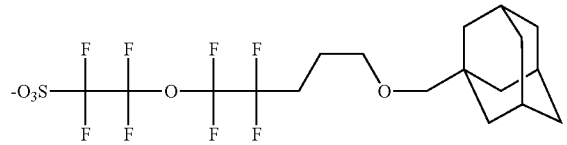
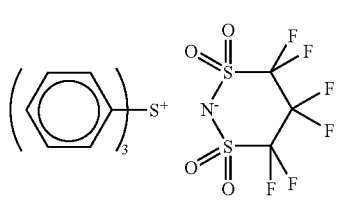
(z55)
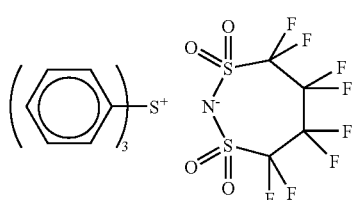
(z56)
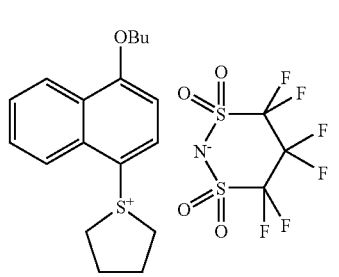
(z57)
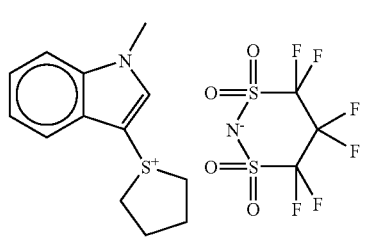
(z58)

(z59)

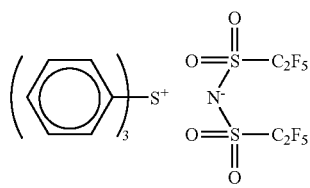

(z60)

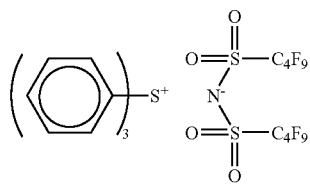

(z61)

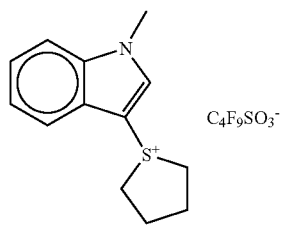

(z62)

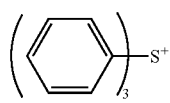

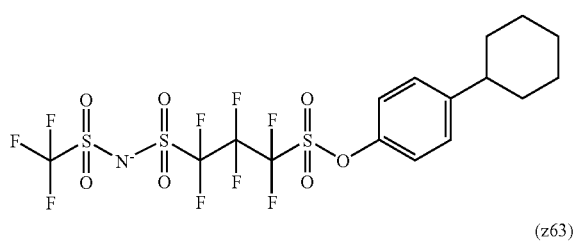

(z63)

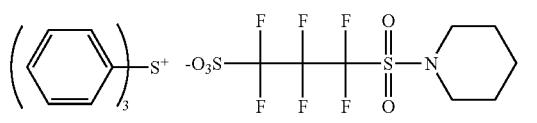

(z64)

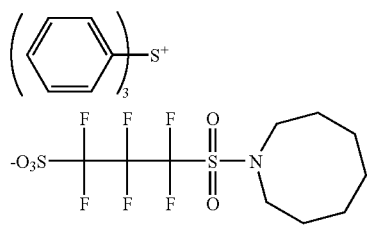

(z65)

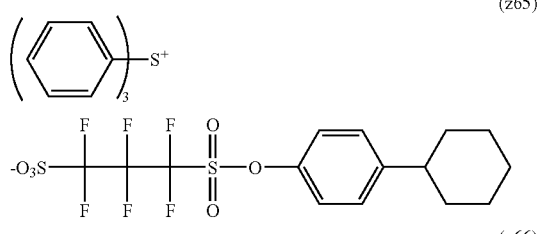

(z66)

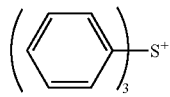

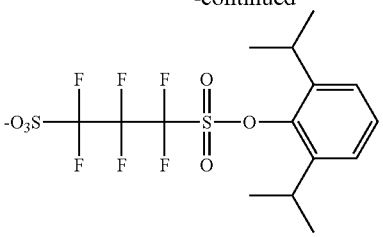

One of these acid generators may be used alone, or two or more species thereof may be used in combination. In the case of using two or more species in combination, compounds capable of generating two kinds of organic acids differing in the total atom number except for hydrogen atom by 2 or more are preferably combined.

The content of the acid generator is preferably from 0.1 to 20 mass %, more preferably from 0.5 to 10 mass %, still more preferably from 1 to 7 mass %, based on the entire solid content of the resist composition.

(C) Resin Having Fluorine Atom and/or Silicon Atom

The positive resist composition of the present invention contains at least either one of (C1) a resin having at least either a fluorine atom or a silicon atom and having an alicyclic structure and (C2) a resin containing a repeating unit having at least either a fluorine atom or a silicon atom in the side chain and a repeating unit having an unsubstituted alkyl group in the side chain. Hereinafter, the resins (C1) and (C2) are collectively referred to as a resin (C).

<(C1) Resin Having at Least Either a Fluorine Atom or a Silicon Atom and Having an Alicyclic Structure>

The at least either fluorine atom or silicon atom and the alicyclic structure of the resin (C1) may be present in the same repeating unit or in separate repeating units.

The fluorine atom, silicon atom and alicyclic structure may be present in any of main chain, side chain and terminal of the resin.

The resin (C1) contains at least either a fluorine atom or a silicon atom in an amount of generally from 5 to 70 mass %, preferably from 10 to 60 mass %, in the resin.

The resin (C1) contains an alicylcic structure in an amount of generally from 5 to 70 mass %, preferably from 10 to 30 mass %, in the resin.

The alicyclic structure may be either monocyclic or polycyclic and may have a substituent.

Examples of the alicyclic structure are set forth below, but the present invention is not limited thereto.

(1)

(2)

(3)

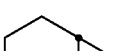

(4)

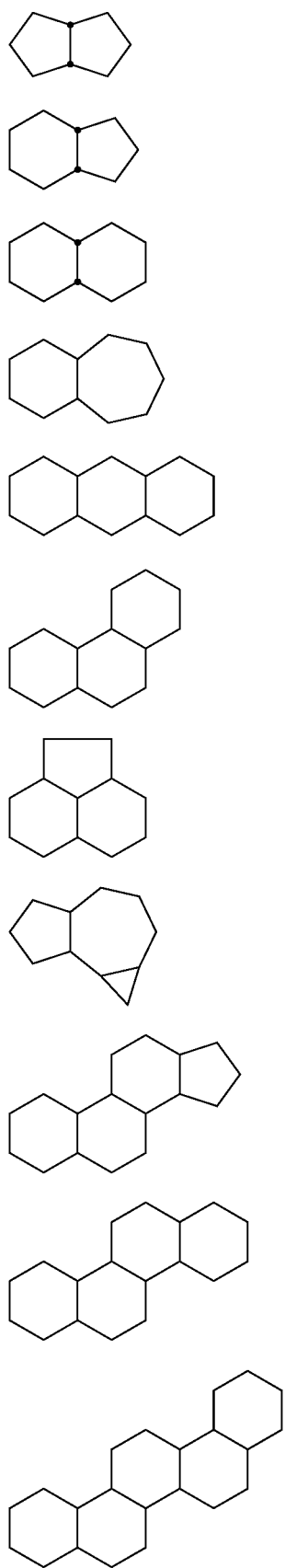
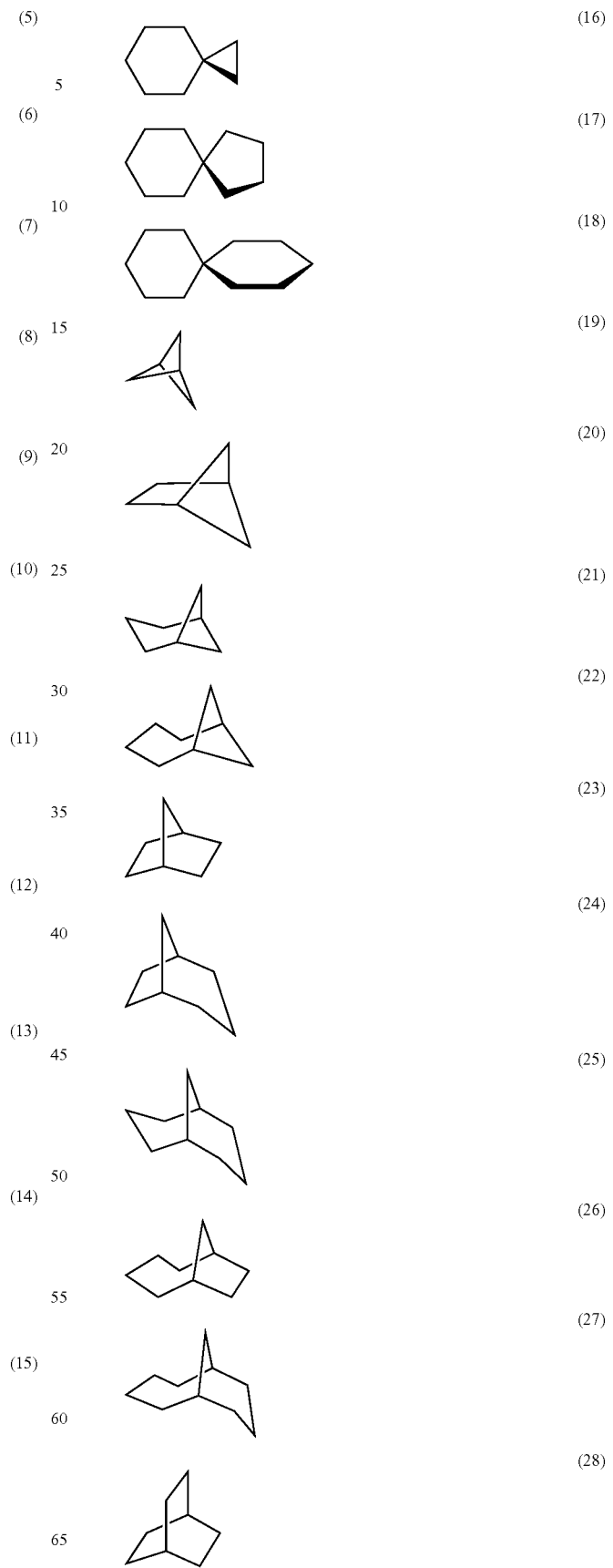

(29)
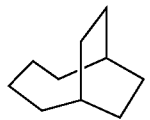

(30)

(31)
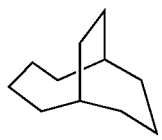

(32)
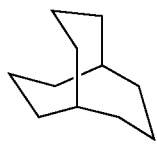

(33)
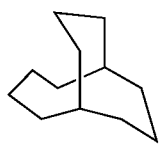

(34)
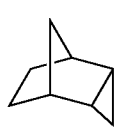

(35)
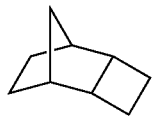

(36)
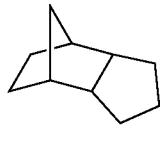

(37)

(38)

(39)

(40)
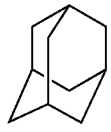

(41)
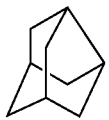

(42)

(43)
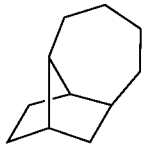

(44)
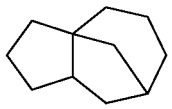

(45)

(46)
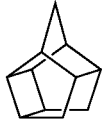

(47)

(48)

(49)

(50)
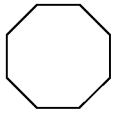

Among these, more preferred are cyclopropane, cyclopentane, cyclohexane, cycloheptane, norbornane, tricyclodecane and adamantane.

The repeating unit having the alicyclic structure in the main chain includes, for example, a repeating unit represented by formula (Q-1), and the repeating unit having the alicyclic structure in the side chain include, for example, repeating units represented by formulae (Q-2) to (Q-4).

(Q-1)
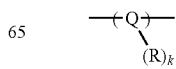

-continued

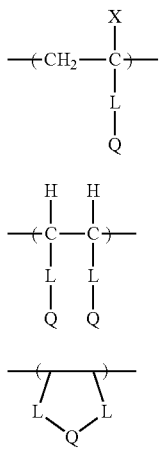

(Q-2)

(Q-3)

(Q-4)

R represents an organic group or a halogen atom.
k represents an integer of 0 to 3.
L represents a linking group.
X represents a hydrogen atom, an alkyl group (for example, a halogenated alkyl group as a substituted alkyl group), or a halogen atom.
Q represents an alicyclic structure.

The alicyclic structure of Q is preferably cyclopropane, cyclopentane, cyclohexane, cycloheptane, norbornane, tricyclodecane or adamantane.

The linking group of L is not particularly limited but is preferably a linking group having a carbon number of 4 or less. The linking group is preferably a single bond, or a sole group or a combination of two or more groups, selected from the group consisting of an alkylene group, a cycloalkylene group, an ether group, a thioether group, a carbonyl group, an ester group, an amide group, a sulfonamide group, a urethane group and a urea group.

The organic group of R is preferably an organic group having a carbon number of 20 or less, and examples thereof include an alkyl group, an alkoxy group, a carboxyl group and an alkoxycarbonyl group.

The repeating unit represented by formula (Q-1) is preferably a repeating unit represented by formula (Q-5) or (Q-6):

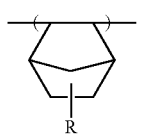

(Q-5)

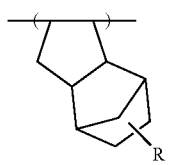

(Q-6)

R has the same meaning as in formula (Q-1).

The repeating unit having the at least either fluorine atom or silicon atom of the resin (C1) is not particularly limited, and examples thereof include the above-described repeating unit having an alicyclic structure, and various repeating units described for the acid-decomposable resin (A) where the hydrogen atom is substituted by a fluorine atom or the carbon atom is replaced by a silicon atom.

<(C2) Resin Containing a Repeating Unit Having at Least Either a Fluorine Atom or a Silicon Atom in the Side Chain and a Repeating Unit Having an Unsubstituted Alkyl Group in the Side Chain>

For example, the repeating unit having at least either a fluorine atom or a silicon atom in the side chain include a repeating unit represented by formula (1), and the repeating unit having an unsubstituted alkyl group in the side chain include a repeating unit represented by formula (2):

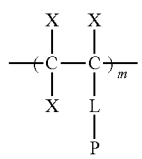

(1)

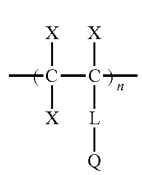

(2)

X represents a hydrogen atom, an alkyl group (halogenated alkyl group) or a halogen atom.

L represents a linking group preferably having a carbon number of 4 or more. The linking group is preferably a single bond, or a sole group or a combination of two or more groups, selected from the group consisting of an alkylene group, a cycloalkylene group, an ether group, a thioether group, a carbonyl group, an ester group, an amido group, a sulfonamido group, a urethane group and a urea group, more preferably an ether group or an ester group.

P represents an organic group having at least either one of a fluorine atom and a silicon atom, and the organic group may be linear, branched or cyclic and is preferably an organic group having a carbon atom of 20 or less. The organic group having a silicon atom may have a siloxane structure. Examples of P include a group where in an organic group such as alkyl group, aryl group and heterocyclic ring, the hydrogen atom is substituted by a fluorine atom or the carbon atom is replaced by a silicon atom.

In the organic group of P, the total number of fluorine atoms and silicon atoms is preferably from 3 to 15, more preferably from 5 to 10.

Q represents an unsubstituted alkyl group preferably having a carbon number of 4 to 20, more preferably from 7 to 15, and the unsubstituted alkyl group may be linear, branched or cyclic and is preferably branched or cyclic.

m/n (molar ratio) is from 1/99 to 99/1, preferably from 10/90 to 90/10.

Specific examples of the repeating unit represented by formula (1) are set forth below, but the present invention is not limited thereto.

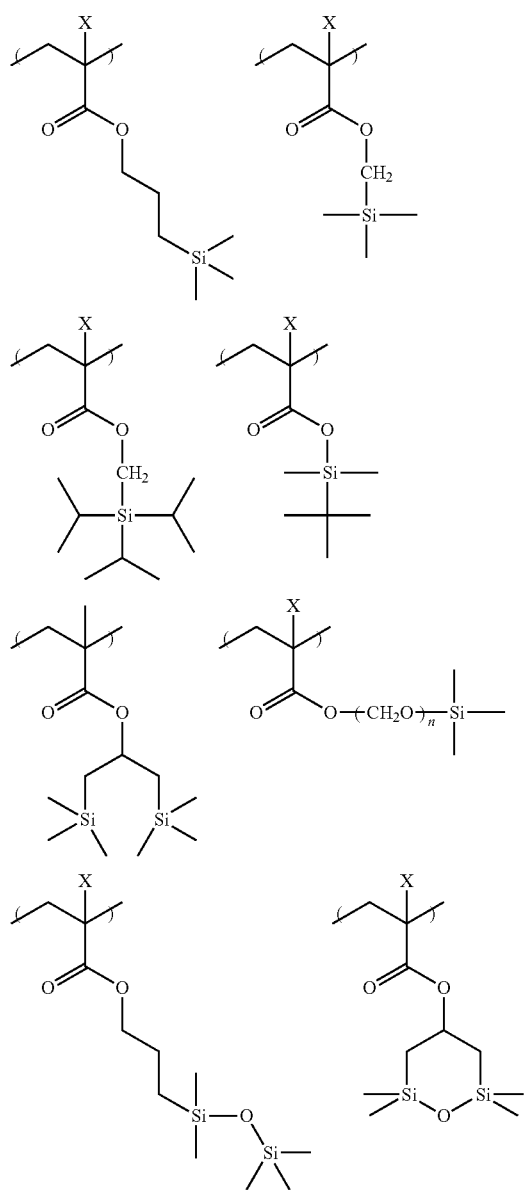
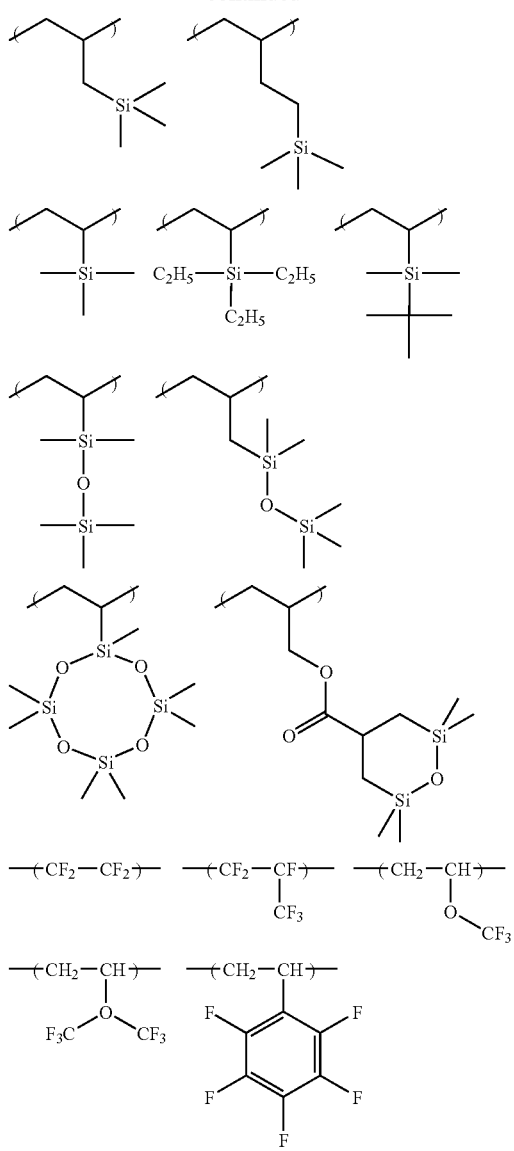

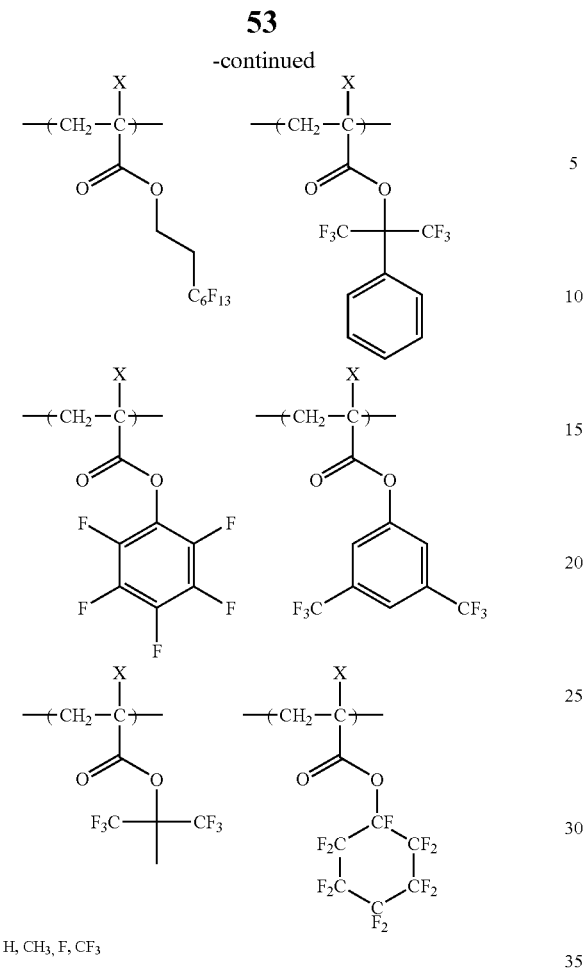

X = H, CH₃, F, CF₃

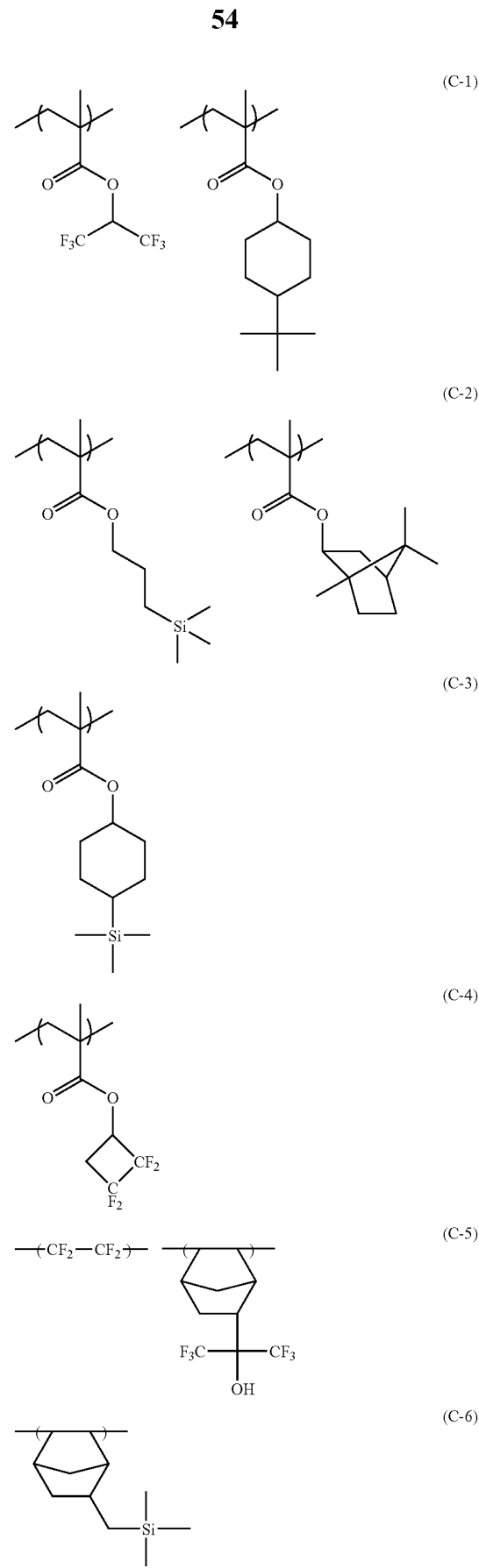

The resins (C1) and (C2) each is preferably insoluble in an alkali developer and preferably does not contain (x) an alkali-soluble group, (y) a group capable of decomposing under the action of an alkali developer to increase the solubility in an alkali developer, and (z) a group capable of producing an alkali-soluble group under the action of an acid.

Examples of the (x) alkali-soluble group include groups having a phenolic hydroxyl group, a carboxylic acid group, a fluorinated alcohol group, a sulfonic acid group, a sulfonamide group, a sulfonylimide group, an (alkyl-sulfonyl)(alkylcarbonyl)methylene group, an (alkyl-sulfonyl)(alkylcarbonyl)imide group, a bis(alkylcarbonyl)-methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

Among these alkali-soluble groups, preferred are a carbonic acid group, a fluorinated alcohol group (preferably hexafluoroisopropanol) and a sulfanylimide group.

Examples of the (y) group capable of decomposing under the action of an alkali developer to increase the solubility in an alkali developer include a lactone group, an ester group, a sulfonamide group, an acid anhydride and an acid imide group, with a lactone group, a sulfonamide group and an acid imide group being preferred.

Examples of the (z) group capable of producing an alkali-soluble group under the action of an acid include those having the same group as the acid-decomposable group in the acid-decomposable resin (A).

Specific examples are set forth below, but the present invention is not limited thereto.

(C-7) 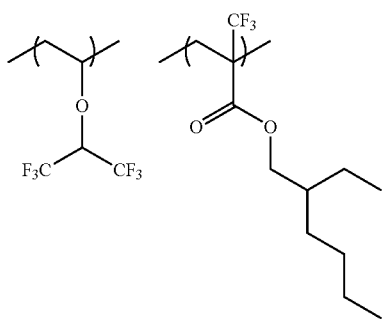

(C-8) 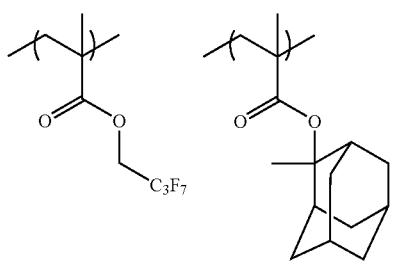

(C-9) 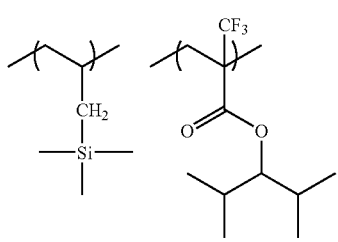

(C-10) 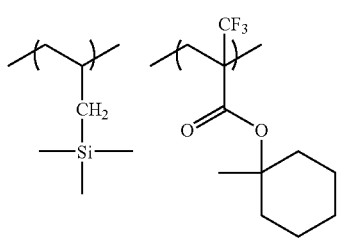

(C-11) 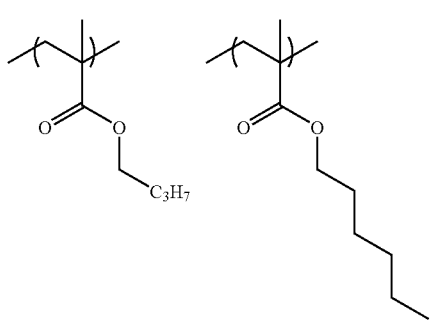

(C-12) 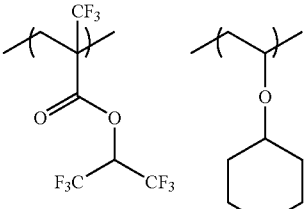

(C-13) 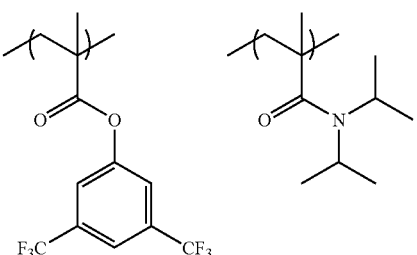

The amount added of the resins (C1) and (C2) is, in terms of the total amount, generally from 0.1 to 5.0 mass %, preferably from 0.2 to 3.0 mass %, more preferably from 0.3 to 2.0 mass %, based on the entire solid content of the composition.

The weight average molecular weight of the resin (C) is preferably from 1,000 to 100,000, more preferably from 1,000 to 50,000.

In the resin (C), the residual monomer amount is preferably from 0 to 10 mass %, more preferably from 0 to 5 mass %. Also, in view of the resolution, resist profile and side wall, roughness or the like of the resist pattern, the molecular weight distribution (Mw/Mn, also called dispersity) is preferably from 1 to 5, more preferably from 1 to 3.

Similarly to the acid-decomposable resin (A), it is preferred that the resin (C) has of course less impurities such as metal and also, the content of the residual monomer or oligomer component is not more than a specific value, for example, 0.1 mass % by HPLC. When these conditions are satisfied, not only the resist can be improved in the sensitivity, resolution, process stability, pattern profile and the like but also a resist ensuring that in-liquid foreign matter, sensitivity and the like are not changed in aging can be obtained.

The resin (C) may be a commercially available product or may be synthesize by an ordinary method, for example, may be obtained by general purification such as radical polymerization employed for the synthesis of the acid-decomposable resin (A).

(D) Solvent

Examples of the solvent which can be used for dissolving respective components described above and, if desired, components described later to prepare a positive resist composition include an organic solvent such as alkylene glycol monoalkyl ether carboxylate, alkylene glycol monoalkyl ether, alkyl lactate, alkyl alkoxypropionate, cyclic lactone having a carbon number of 4 to 10, monoketone compound having a carbon number of 4 to 10 which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone having a carbon number of 4 to 10 include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound having a carbon number of 4 to 10 which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used includes a solvent having a boiling point of 130° C. or more at ordinary temperature and atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more species thereof may be used in combination.

In particular, a solvent containing propylene glycol monomethyl ether acetate is preferred, and the proportion of propylene glycol monomethyl ether acetate contained is preferably from 40 to 100 mass %.

In the present invention, a mixed solvent comprising a solvent containing a hydroxyl group in the structure and a solvent not containing a hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50 mass % or more is preferred in view of coating uniformity.

(E) Basic Compound

The positive resist composition of the present invention preferably comprises (E) a basic compound for reducing the change of performance in aging from exposure until heating.

Preferred examples of the basic compound include compounds having a structure represented by any one of the following formulae (A) to (E):

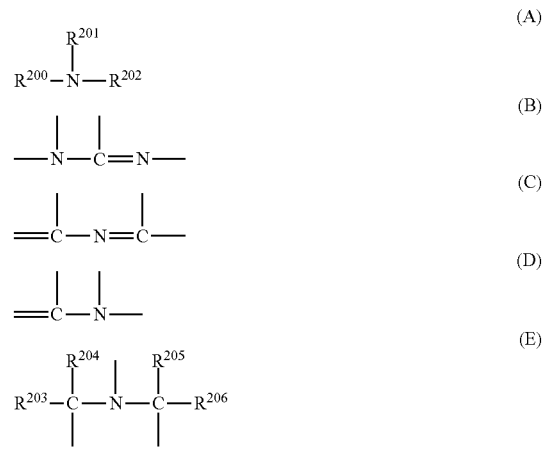

In formulae (A) to (E), $R^{200}$, $R^{201}$ and $R^{202}$, which may be the same or different, each represents a hydrogen atom, an alkyl group having a carbon number of 1 to 20, a cycloalkyl group having a carbon number of 3 to 20, or an aryl group having a carbon number of 6 to 20, and $R^{201}$ and $R^{202}$ may combine with each other to form a ring.

The alkyl group may be unsubstituted or may be an alkyl group having a substituent, and the alkyl group having a substituent is preferably an aminoalkyl group having a carbon number of 1 to 20, a hydroxyalkyl group having a carbon number of 1 to 20, or a cyanoalkyl group having a carbon number of 1 to 20.

$R^{203}$, $R^{204}$, $R^{205}$ and $R^{206}$ which may be the same or different, each represents an alkyl group having a carbon number of 1 to 20.

The alkyl group in these formulae (A) to (E) is more preferably unsubstituted.

Examples of the basic compound include substituted or unsubstituted primary, secondary or tertiary aliphatic amines, aromatic amines, heterocyclic amines, amido derivatives, imide derivatives, and nitrogen-containing compounds having a cyano group. Among these, aliphatic amines, aromatic amines and heterocyclic amines are preferred. The substituent is preferably an amino group, an alkyl group, an alkoxyl group, an acyl group, an acyloxy group, an aryl group, an aryloxy group, a nitro group, a cyano group, an ester group or a lactone group.

One of these basic compounds is used alone, or two or more species thereof are used in combination.

The amount of the basic compound used is usually from 0.001 to 10 mass %, preferably from 0.01 to 5 mass %, based on the solid content of the positive resist composition.

The ratio of the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern in aging after exposure until heat treatment. The acid generator/basic compound (by mol) is more preferably from 5.0 to 200, still more preferably from 7.0 to 150.

(F) Surfactant

The positive resist composition of the present invention preferably further comprises (F) a surfactant, more preferably any one fluorine-containing and/or silicon-containing surfactant (a fluorine-containing surfactant, a silicon-containing surfactant or a surfactant containing both a fluorine atom and a silicon atom) or two or more species thereof.

When the positive resist composition of the present invention contains the (F) surfactant, a resist pattern with good sensitivity, resolution and adhesion as well as less development defects can be obtained when an exposure light source of 250 nm or less, particularly 220 nm or less, is used.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megafac F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNIVA); and FTX-204D, 208G, 218G, 230G, 204D, 208D, 212D, 218 and 222D (produced by NEOS Co., Ltd.). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megafac F178, F-470, F-473, F-475, F-476 and F-472 (produced by Dainippon Ink & Chemicals, Inc.) and further include a copolymer of an acrylate (or methacrylate) having a $C_6F_{13}$ group with a (poly(oxyalkylene)) acrylate (or methacrylate), and a copolymer of an acrylate (or methacrylate) having a $C_3F_7$ group with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or several species thereof may be used in combination.

The amount of the (F) surfactant used is preferably from 0.01 to 10 mass %, more preferably from 0.1 to 5 mass %, based on the entire amount of the positive resist composition (excluding the solvent).

(G) Onium Carboxylate

The positive resist composition of the present invention may comprise (G) an onium carboxylate. Examples of the onium carboxylate include sulfonium carboxylate, iodonium carboxylate and ammonium carboxylate. In particular, the (G) onium carboxylate is preferably an iodonium salt or a sulfonium salt. Furthermore, the carboxylate residue of the (G) onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably an anion of the carboxylic acid with the alkyl group being partially or entirely fluorine-substituted. The alkyl chain may contain an oxygen atom. By virtue of such a construction, the transparency to light of 220 nm or less is ensured, the sensitivity and the resolution are enhanced, and the defocus latitude depended on line pitch and the exposure margin are improved.

Examples of the anion of a fluorine-substituted carboxylic acid include anions of fluoroacetic acid, difluoroacetic acid, trifluoroacetic acid, pentafluoro-propionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid.

These (G) onium carboxylates can be synthesized by reacting a sulfonium, iodonium or ammonium hydroxide and a carboxylic acid with silver oxide in an appropriate solvent.

The content of the (G) onium carboxylate in the composition is suitably from 0.1 to 20 mass %, preferably from 0.5 to 10 mass %, more preferably from 1 to 7 mass %, based on the entire solid content of the composition.

(H) Other Additives

The positive resist composition of the present invention may further contain, for example, a dye, a plasticizer, a photosensitizer, a light absorbent, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

(I) Pattern Forming Method

The positive resist composition of the present invention is preferably used in a film thickness of 30 to 250 nm, more preferably from 30 to 200 nm, from the standpoint of enhancing the resolving power. Such a film thickness can be obtained by setting the solid content concentration in the positive resist composition to an appropriate range and thereby giving an appropriate viscosity to enhance the coatability and film-forming property.

The entire solid content concentration in the positive resist composition is generally from 1 to 10 mass %, preferably from 1 to 8 mass %, more preferably from 1.0 to 7.0 mass %.

The positive resist composition of the present invention is used by dissolving the components described above in a predetermined organic solvent, preferably in the above-described mixed solvent, filtering the solution, and coating it on a predetermined support as follows. The filter used for filtering is preferably a filter made of polytetrafluoroethylene, polyethylene or nylon and having a pore size of 0.1 micron or less, more preferably 0.05 microns or less, still more preferably 0.03 microns or less.

For example, the positive resist composition is coated on a substrate (e.g., silicon/silicon dioxide-coated substrate) as used in the production of a precision integrated circuit device, by an appropriate coating method such as spinner or coater, and then dried to form a photosensitive film. Incidentally, an antireflection film may be previously provided by coating.

The photosensitive film is irradiated with actinic rays or radiation through a predetermined mask, preferably baked (heated), then developed and rinsed, whereby a good resist pattern can be obtained.

Examples of the actinic rays or radiation include infrared light, visible light, ultraviolet light, far ultraviolet light, X-ray and electron beam, but the radiation is preferably far ultraviolet light at a wavelength of 250 nm or less, more preferably 220 nm or less. Specific examples thereof include KrF excimer laser light (248 nm), ArF excimer laser light (193 nm), F2 excimer laser light (157 nm), X-ray and electron beam. ArF excimer laser light, $F_2$ excimer laser light, EUV (13 nm) and electron beam are preferred.

In the development step, an alkali developer is used as follows. The alkali developer which can be used for the resist composition is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

After the development or rinsing, the developer or rinsing solution adhering on the pattern may removed by a supercritical fluid.

The exposure may be performed by filling a liquid (immersion medium) having a refractive index higher than that of air between the resist film and a lens at the irradiation with actinic rays or radiation (immersion exposure). By this exposure, the resolution can be enhanced. The immersion medium used may be any liquid as long as it has a refractive index higher than that of air, but pure water is preferred. Also, in order to prevent the immersion medium and the photosensitive film from coming into direct contact at the immersion exposure, an overcoat layer may be further provided on the photosensitive film. In this case, the composition can be restrained from dissolving out into the immersion medium from the photosensitive film and the development defects can be reduced.

The immersion liquid used in the immersion exposure is described below.

The immersion liquid is preferably a liquid transparent to light at the exposure wavelength and having a small temperature coefficient of refractive index as much as possible so as to minimize the distortion of an optical image projected on the resist. Particularly, when the exposure light source is an ArF excimer laser (wavelength: 193 nm), water is preferably used in view of easy availability and easy handleability, in addition to the above-described aspects.

Furthermore, a medium having a refractive index of 1.5 or more can also be used because the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist layer on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is mingled, this incurs distortion of the optical image projected on the resist. Therefore, the water used is preferably distilled water. Pure water after further filtration through an ion exchange filter or the like may also be used.

The electrical resistance of water is preferably 18.3 MΩcm or more, and TOC (organic material concentration) is preferably 20 ppb or less. Also, the water is preferably subjected to a deaeration treatment.

The lithography performance can be enhanced by increasing the refractive index of the immersion liquid. From such an aspect, an additive for increasing the refractive index may be added to water, or heavy water ($D_2O$) may be used in place of water.

In order to prevent the resist film from directly contacting with the immersion liquid, an immersion liquid sparingly soluble film (hereinafter, sometimes referred to as a "topcoat") may be provided between the immersion liquid and the resist film formed of the positive resist composition of the present invention. The functions required of the topcoat are suitability for coating on the resist upper layer part, transparency to radiation particularly at 193 nm, and low solubility in the immersion liquid. It is preferred that the topcoat does not intermix with the resist and can be uniformly coated on the resist upper layer.

In view of transparency to light at 193 nm, the topcoat preferably comprises an aromatic-free polymer, and specific examples thereof include a hydrocarbon polymer, an acrylic acid ester polymer, a polymethacrylic acid, a polyacrylic acid, a polyvinyl ether, a silicon-containing polymer and a fluorine-containing polymer. If impurities dissolve out into the immersion liquid from the topcoat, the optical lens is contaminated. In this viewpoint, the residual monomer components of the polymer are preferably less contained in the topcoat.

On peeling off the topcoat, a developer may be used or a releasing agent may be separately used. The releasing agent is preferably a solvent less permeating into the resist. From the standpoint that the peeling step can be performed simultaneously with the resist development step, the topcoat is preferably peelable with an alkali developer and in the light of peeling with an alkali developer, the topcoat is preferably acidic, but in view of non-intermixing with the resist, the topcoat may be neutral or alkaline.

With no difference in the refractive index between the topcoat and the immersion liquid, the resolving power is enhanced. At the exposure with an ArF excimer laser (wavelength: 193 nm), when water is used as the immersion liquid, the topcoat for ArF immersion exposure preferably has a refractive index close to the refractive index of the immersion liquid. From the standpoint of approximating the refractive index to that of the immersion liquid, the topcoat preferably contains a fluorine atom. Also, in view of transparency and refractive index, the topcoat is preferably a thin film.

The topcoat is preferably free of intermixing with the resist and further with the immersion liquid. From this standpoint, when the immersion liquid is water, the topcoat solvent is preferably a medium which is sparingly soluble in the resist solvent and insoluble in water. Furthermore, when the immersion liquid is an organic solvent, the topcoat may be either water-soluble or water-insoluble.

When the resist composition of the present invention is formed as a resist film, the receding contact angle of water for the resist film is preferably 65° or more. This receding contact angle is a receding contact angle at ordinary temperature and atmospheric pressure. The receding contact angle is a contact angle on the receding end of a liquid droplet when the liquid droplet starts sliding down after the resist film is inclined.

EXAMPLES

The present invention is described in greater detail below by referring to Examples, but the present invention should not be construed as being limited thereto.

Examples 1 to 20 and Comparative Example 1

The structures, compositions, molecular weights and the like of the acid-decomposable resin (A) used in Examples are shown below. The composition is shown by the structural formula number of resin and the compositional ratio (from the left in the structural formula).

TABLE 1

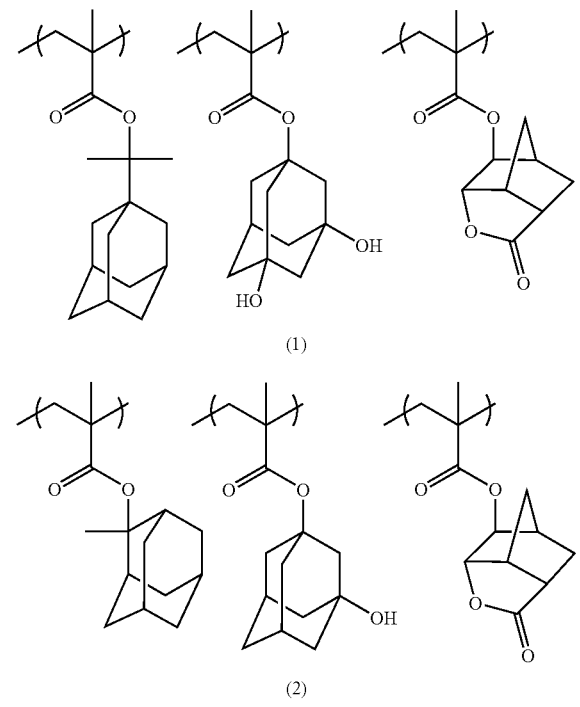

(1)

(2)

TABLE 1-continued
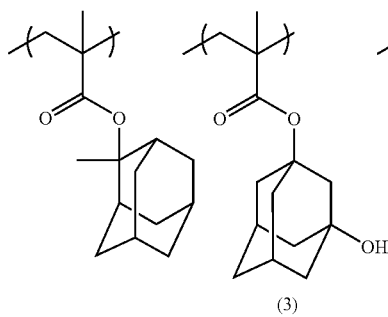
(3)
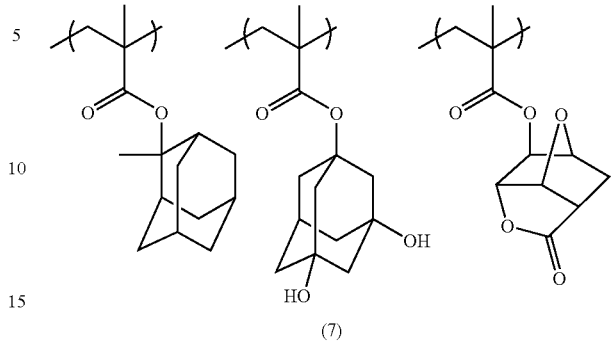
(7)
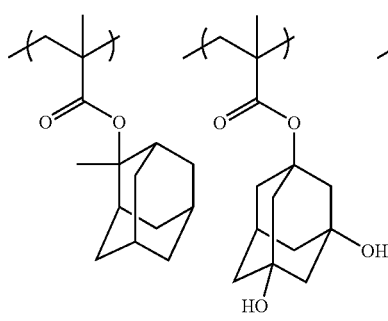
(4)
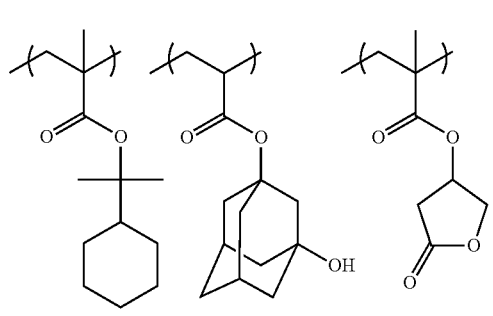
(8)
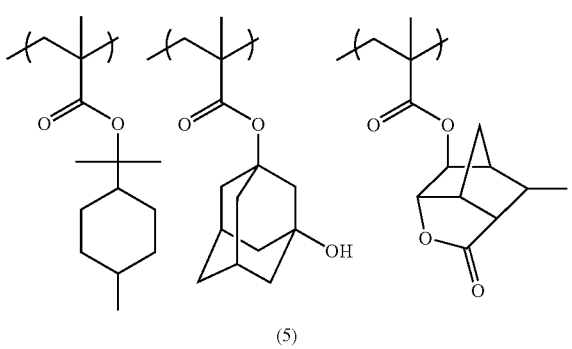
(5)
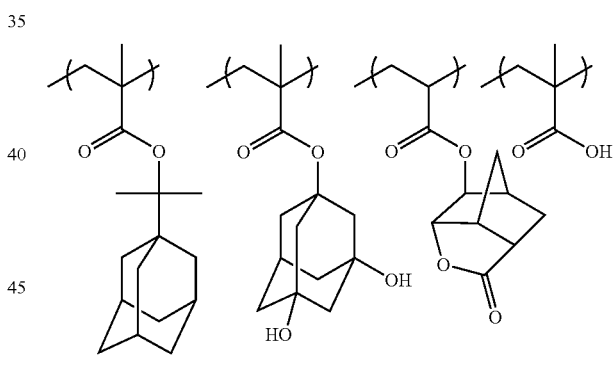
(9)
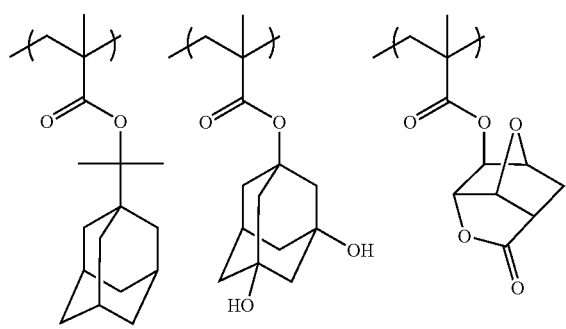
(6)
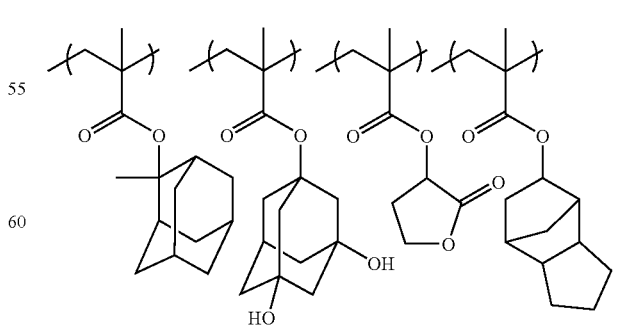
(10)

TABLE 1-continued

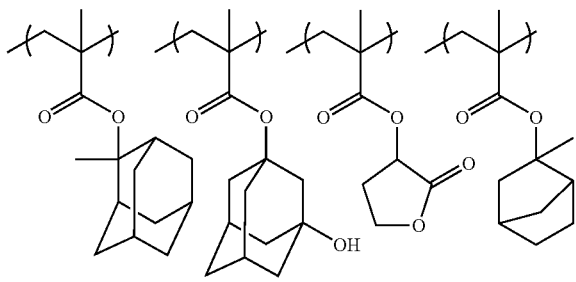

(11)

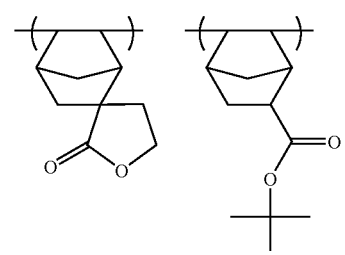

(12)

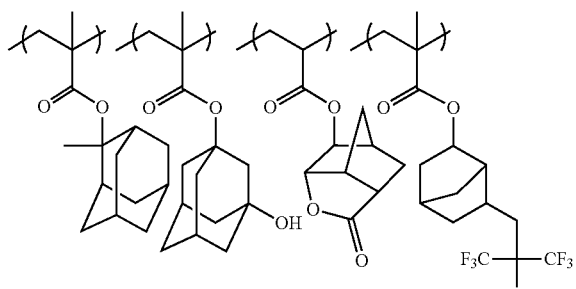

(13)

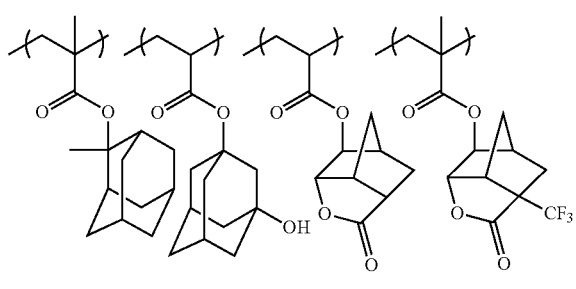

(14)

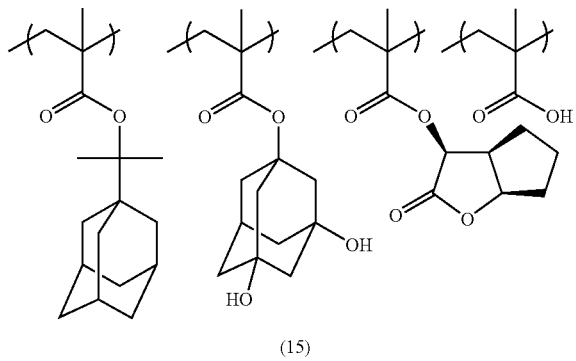

(15)

TABLE 1-continued

| Resin | Composition | Mw | Mw/Mn |
|---|---|---|---|
| 1 | 24/30/46 | 9800 | 1.9 |
| 2 | 30/25/45 | 8500 | 2.0 |
| 3 | 34/33/33 | 11000 | 2.3 |
| 4 | 45/15/40 | 10500 | 2.1 |
| 5 | 30/25/45 | 8400 | 2.3 |
| 6 | 39/20/41 | 10500 | 2.1 |
| 7 | 49/10/41 | 9500 | 2.5 |
| 8 | 35/32/33 | 14000 | 2.6 |
| 9 | 40/20/35/5 | 12500 | 2.4 |
| 10 | 40/15/40/5 | 10000 | 1.8 |
| 11 | 40/15/40/5 | 9800 | 2.3 |
| 12 | 50/50 | 5200 | 2.1 |
| 13 | 35/20/40/5 | 6100 | 2.3 |
| 14 | 30/30/30/10 | 8600 | 2.5 |
| 15 | 40/20/35/5 | 12000 | 2.1 |

Synthesis Example (1)

Synthesis of Resin (C-1)

Hexafluoroisopropyl methacrylate and tert-butylcyclohexyl methacrylate were charged at a ratio of 50/50 and dissolved in cyclohexanone to prepare 450 g of a solution having a solid content concentration of 22%. To this solution, 5 mol % of polymerization initiator V-601 produced by Wako Pure Chemical Industries, Ltd. was added. The resulting solution was added dropwise to 50 mL of cyclohexanone heated at 80° C., over 2 hours in a nitrogen atmosphere. After the completion of dropwise addition, the reaction solution was stirred for 2 hours to obtain Reaction Solution (C-1). After the completion of reaction, Reaction Solution (C-1) was cooled to room temperature and crystallized from a 10-fold amount of methanol, and the precipitated white powder was collected by filtration to recover the objective Resin (C-1).

The polymer compositional ratio determined from $^1$HNMR was 50/50, the weight average molecular weight determined by the GPC measurement and calculated in terms of standard polystyrene was 13,000, and the dispersity was 1.8.

Resins (C-2) to (C-4) and (C-7) to (C-13) were synthesized in the same manner as in Synthesis Example (1).

Synthesis Example (2)

Synthesis of Resin (C-5)

A 1,1,2-trichloro-trifluoroethylene 150 ml solution containing 52 g (0.20 mol) of 2-(5-norbornene)hexafluoro-2-propanol was charged in a 1 L-volume autoclave, and the system was pressurized to 200 psi in a nitrogen atmosphere. Furthermore, 20 g (0.20 mol) of tetrafluoroethylene was poured thereinto, and the mixture was heated at 50° C. under stirring. In this reaction solution, a 1,1,2-trichloro-trifluoroethylene 15 ml solution containing 1.2 g of di(4-tert-butylcyclohexyl)peroxydicarbonate was poured over 20 minutes, and the stirring was further continued for 20 hours. After the completion of reaction, the reaction solution was charged into 2 L of methanol while vigorously stirring to precipitate a white resin.

The obtained powder was measured by gel permeation chromatography (GPC) and found to have a weight average molecular weight of 8,000 and a dispersity of 1.4. Also, the polymer compositional ratio determined from 1H-NMR, 13C-NMR and 19F-NMR was 50/50.

Synthesis Example (3)

Synthesis of Resin (C-6)

Di-μ-chlorobis[(η-allyl)palladium(2)] (0.262 g) and 0.488 g of silver hexafluoroantimonate were dissolved in 44 mL of chlorobenzene, and the resulting solution was stirred at room temperature. After 20 minutes, the reaction mixture was filtered. The filtrate was added to a mixed solution consisting of 26.09 g of 5-norbornene-2-trimethylsilylmethyl, 0.2 mL of water and 170 mL of chlorobenzene. The resulting mixture was further stirred at room temperature for 20 hours and then added to 1,200 mL of methanol. The precipitated resin was separated by filtration and dissolved in 150 mL of chlorobenzene. To this solution, 30 mL of methanol and 3.2 g of sodium boron hydride were added. The resulting mixture was stirred at room temperature for 3 hours and then left standing at room temperature for 24 hours. The precipitated Pd(0) particles were removed by filtration, the filtrate was poured into 1,000 mL of methanol, and the precipitated resin was separated by filtration to obtain 15.21 g of the objective resin.

The weight average molecular weight determined by the GPC measurement and calculated in terms of standard polystyrene was 4,800, and the dispersity was 1.8.

The structures and weight average molecular weights of Resins (C-1) to (C-13) are shown together below.

TABLE 2

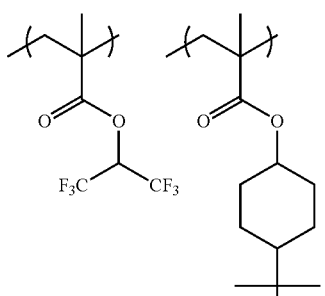

(C-1)

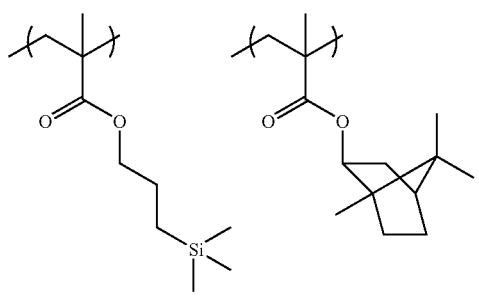

(C-2)

TABLE 2-continued

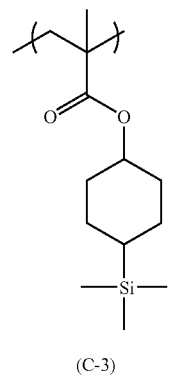

(C-3)

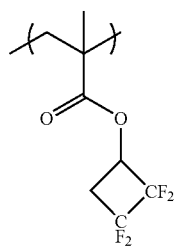

(C-4)

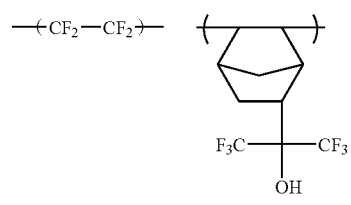

(C-5)

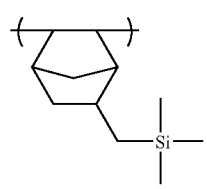

(C-6)

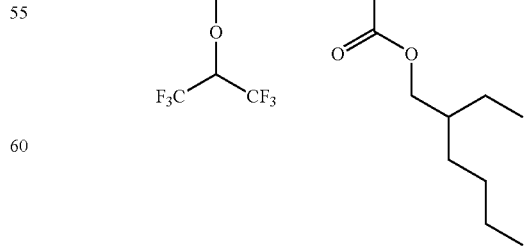

(C-7)

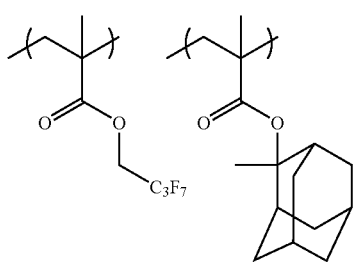

(C-8)

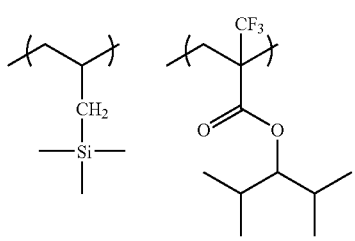

(C-9)

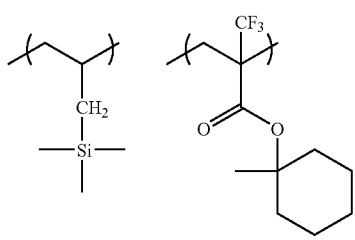

(C-10)

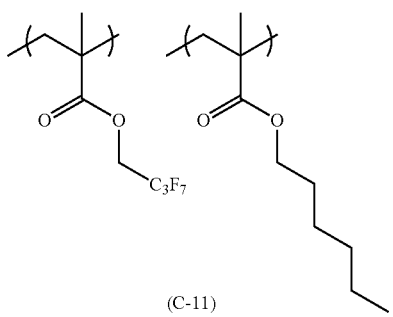

(C-11)

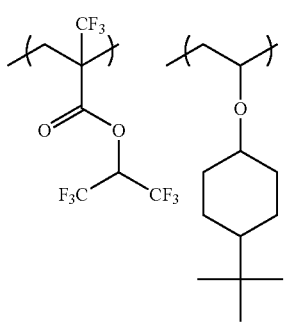

(C-12)

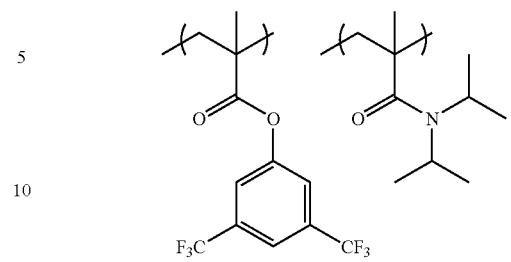

(C-13)

| Resin | Composition | Mw | Mw/Mn |
|---|---|---|---|
| C-1 | 50/50 | 13000 | 1.8 |
| C-2 | 50/50 | 15000 | 2.1 |
| C-3 | 100 | 10200 | 2.0 |
| C-4 | 100 | 5100 | 1.8 |
| C-5 | 50/50 | 8000 | 1.4 |
| C-6 | 100 | 4800 | 1.8 |
| C-7 | 50/50 | 8500 | 1.7 |
| C-8 | 80/20 | 9800 | 2.2 |
| C-9 | 50/50 | 6300 | 1.8 |
| C-10 | 50/50 | 5500 | 1.9 |
| C-11 | 60/40 | 13000 | 2.3 |
| C-12 | 50/50 | 8400 | 2.0 |
| C-13 | 20/80 | 12000 | 2.3 |

<Preparation of Resist>

The components shown in Table 2 below were dissolved in a solvent to prepare a solution having a solid content concentration of 5.5 mass %, and this solution was filtered through a 0.1-μm polyethylene filter to prepare a positive resist solution. The positive resist solutions prepared were evaluated by the following methods, and the results obtained are shown in the Table below. As for each component in the Table, when a plurality of species were used, the ratio is a ratio by mass.

[Image Performance Test]

(Exposure Condition (1))

An organic antireflection film, ARC29A (produced by Nissan Chemical Industries, Ltd.), was coated on a silicon wafer and baked at 205° C. for 60 seconds to form a 78-nm antireflection film, and the positive resist solution prepared above was coated thereon and baked at 120° C. for 60 seconds to form a 150-nm resist film. The obtained wafer was subjected to pattern exposure by using an ArF excimer laser scanner (PAS5500/1100, manufactured by ASML, NA: 0.75, σo/σi: 0.85/0.55). Thereafter, the resist film was heated at 120° C. for 60 seconds, developed with an aqueous tetramethylammonium hydroxide solution (2.38 mass %) for 30 seconds, rinsed with pure water and spin-dried to obtain a resist pattern.

(Exposure Condition (2))

This condition is for forming a resist pattern by an immersion exposure method using pure water.

An organic antireflection film, ARC29A (produced by Nissan Chemical Industries, Ltd.), was coated on a silicon wafer and baked at 205° C. for 60 seconds to form a 78-nm antireflection film, and the positive resist solution prepared above was coated thereon and baked at 120° C. for 60 seconds to form a 250-nm resist film. The obtained wafer was subjected to pattern exposure by using an ArF excimer laser immersion scanner (NA: 0.75). The immersion liquid used was ultrapure water having an impurity content of 5 ppb or less. Thereafter, the resist film was heated at 120° C. for 60 seconds, developed with an aqueous tetramethylammonium hydroxide solution (2.38 mass %) for 30 seconds, rinsed with pure water and spin-dried to obtain a resist pattern.

[Profile]

The profile of the obtained pattern was observed by a scanning electron microscope (S-9260, manufactured by Hitachi, Ltd.) and evaluated.

[Defocus Latitude (DOF)]

The width of the focal depth of reproducing a line width of 100 nm±10% at the optimal exposure amount was observed. As the value is larger, the defocus latitude is wider and this is more preferred.

These evaluation results are shown in Table 2.

W-5: PF656 (produced by OMNOVA) (fluorine-containing)
W-6: PF6320 (produced by OMNOVA) (fluorine-containing)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate It is seen from these results that the resist composition of the present invention provides a pattern with a good profile not only at the dry exposure but also at the immersion exposure and allows wide defocus latitude.

TABLE 3

| | | Composition | | | | | Evaluation Results | | | |
|---|---|---|---|---|---|---|---|---|---|---|
| | | Photoacid | | Basic | Alkali-Soluble | Surfactant | Normal Exposure | | Immersion Exposure | |
| | Resin | Generator | Solvent | Compound | Compound (C) | Except for | | | | |
| | (2 g) | (mg) | (mass ratio) | (mg) | (mg) | (F) (mg) | Profile | DOF | Profile | DOF |
| Example 1 | 1 | z2 (80) | SL-4/SL-2 40/60 | N-5 (7) | C-1 (20) | W-1 (3) | rectangular | 0.5 | rectangular | 0.6 |
| Example 2 | 2 | z51 (100) | SL-2/SL-4/SL-6 40/59/1 | N-6 (10) | C-1 (120) | W-3 (3) | rectangular | 0.5 | rectangular | 0.6 |
| Example 3 | 3 | z2/z55 (20/100) | SL-2/SL-4 70/30 | N-3 (6) | C-2 (30) | W-6 (3) | rectangular | 0.5 | rectangular | 0.6 |
| Example 4 | 4 | z9 (100) | SL-2/SL-4 60/40 | — | C-2 (10) | W-1 (5) | rectangular | 0.5 | rectangular | 0.6 |
| Example 5 | 5 | z65/z9 (20/80) | SL-3/SL-4 30/70 | N-6 (10) | C-3 (30) | W-5 (4) | rectangular | 0.5 | rectangular | 0.6 |
| Example 6 | 6 | z44/z65 (25/80) | SL-2/SL-4/SL-5 40/58/2 | N-1 (7) | C-4 (30) | W-1 (4) | rectangular | 0.4 | rectangular | 0.5 |
| Example 7 | 7 | z55/z47 (30/60) | SL-1/SL-2 60/40 | N-4 (13) | C-5 (20) | W-6 (4) | rectangular | 0.5 | rectangular | 0.6 |
| Example 8 | 8 | z44/z65 (50/50) | SL-1/SL-2 60/40 | N-3 (6) | C-6 (50) | W-2 (3) | rectangular | 0.5 | rectangular | 0.6 |
| Example 9 | 9 | z65 100 | SL-2/SL-4/SL-6 40/59/1 | N-2 (9) | C-7 (30) | W-3 (3) | rectangular | 0.4 | rectangular | 0.5 |
| Example 10 | 10 | z15/z37 (80/50) | SL-2/SL-4/SL-6 40/59/1 | N-6 (10) | C-8 (20) | W-4 (5) | rectangular | 0.5 | rectangular | 0.6 |
| Example 11 | 11 | z15/z37 (80/50) | SL-2/SL-4 60/40 | N-1 (7) | C-9 (20) | W-4 (3) | rectangular | 0.4 | rectangular | 0.5 |
| Example 12 | 12 | z55/z65 40/60 | SL-1/SL-2 50/50 | N-3 (6) | C-10 (20) | W-1 (3) | rectangular | 0.4 | rectangular | 0.5 |
| Example 13 | 13 | z2/z15 (40/60) | SL-2/SL-4/SL-6 40/59/1 | N-6 (10) | C-11 (15) | W-4 (5) | rectangular | 0.5 | rectangular | 0.6 |
| Example 14 | 14 | z62 (120) | SL-2/SL-4/SL-6 40/59/1 | N-1 (7) | C-12 (50) | W-2 (5) | rectangular | 0.4 | rectangular | 0.5 |
| Example 15 | 15 | z44 (80) | SL-1/SL-2 60/40 | N-1 (7) | C-13 (30) | W-1 (3) | rectangular | 0.5 | rectangular | 0.6 |
| Comparative Example 1 | 1 | z2 (80) | SL-4/SL-2 40/60 | N-5 (7) | — | W-1 (5) | film loss | 0.2 | film loss | 0.3 |
| Comparative Example 2 | 2 | z51 (100) | SL-2/SL-4/SL-6 40/59/1 | N-2 (10) | — | W-1 (3) | film loss | 0.2 | film loss | 0.3 |

The symbols in Table 2 denote the followings.
The acid generators are corresponding to those described above.

N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
W-1: Megafac F176 (produced by Dainippon Ink & Chemicals, Inc.) (fluorine-containing)
W-2: Megafac R08 (produced by Dainippon Ink & Chemicals, Inc.) (fluorine- and silicon-containing)
W-3: Polysiloxane polymer KP-341 (produced by Shin-Etsu Chemical Co., Ltd.) (silicon-containing)
W-4: Troysol S-366 (produced by Troy Chemical)

According to the present invention, a positive resist composition capable of forming a good profile and allowing wide exposure latitude (DOF), and a pattern forming method using the composition can be provided.

The entire disclosure of each and every foreign patent application from which the benefit of foreign priority has been claimed in the present application is incorporated herein by reference, as if fully set forth.

What is claimed is:

1. A positive resist composition, which comprises:
   (A) a resin of which solubility in an alkali developer increases under an action of an acid;
   (B) a compound capable of generating an acid upon irradiation with actinic rays or radiation;
   (C) a resin having at least one of a fluorine atom and a silicon atom; and (D) a solvent, wherein the resin (A) contains at least one repeating unit having an alicyclic hydrocarbon-containing partial structure represented by any one of the following formulae (pI) to (pV):

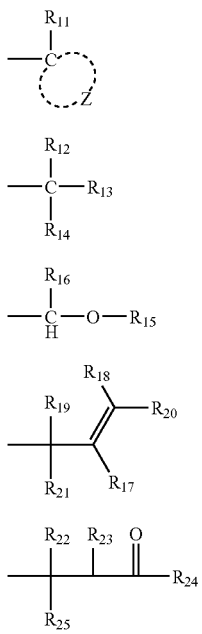

wherein, $R_{11}$ represents a methyl group, an ethyl group, an n-propyl group, an isopropyl group, an n-butyl group, an isobutyl group or a sec-butyl group; Z represents an atomic group necessary for forming a cycloalkyl group together with the carbon atom;

$R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group;

$R_{17}$ to $R_{21}$ each independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group, and $R_{22}$ to $R_{25}$ each independently represents a hydrogen atom, a linear or branched alkyl group having a carbon number of 1 to 4 or a cycloalkyl group, provided that at least one of $R_{22}$ to $R_{25}$ represents a cycloalkyl group, $R_{23}$ and $R_{24}$ may combine with each other to form a ring;

wherein the resin (C) is (C2) a resin containing a repeating unit having at least one of a fluorine atom and a silicon atom in a side chain and a repeating unit having an unsubstituted alkyl group in a side chain, and the added amount of the resin (C2) is from 0.1 to 5.0 mass % based on the entire solids content of the composition, and wherein the resin (C2) contains a repeating unit having at least one of a fluorine atom and a silicon atom in a side chain represented by formula (1) and a repeating unit having an unsubstituted alkyl group in a side chain represented by formula (2):

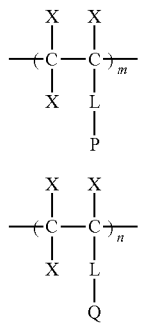

wherein X represents a hydrogen atom, a halogenated or unsubstituted alkyl group or a halogen atom;

L represents a linking group;

P represents an organic group having at least either one of a fluorine atom and a silicon atom;

Q represents an unsubstituted alkyl group, which is branched or cyclic; and the molar ratio m/n is from 1/99 to 99/1.

2. A pattern forming method, which comprises:

forming a resist film from a positive resist composition according to claim 1; and subjecting the resist film to immersion exposure and development.

3. The positive resist composition according to claim 1, wherein L represents a single bond, or a sole group or a combination of two or more groups, selected from the group consisting of an alkylene group, a cycloalkylene group, an ether group, a thioether group, a carbonyl group, an ester group, an amido group, a sulfonamide group, a urethane group and a urea group.

4. The positive resist composition according to claim 3, wherein L represents an ether group or an ester group.

5. The positive resist composition according to claim 1, wherein the organic group represented by P has a carbon atom of 20 or less.

6. The positive resist composition according to claim 1, wherein the organic group represented by P has a total number of fluorine atoms and silicon atoms from 3 to 15.

7. The positive resist composition according to claim 1, wherein the unsubstituted alkyl group represented by Q in formula (2) has a carbon number of 4 to 20.

8. The positive resist composition according to claim 1, wherein the resin (A) does not have a fluorine atom.

9. The positive resist composition according to claim 1, wherein the resin (A) has no aromatic group.

10. The positive resist composition according to claim 1, wherein the resin (A) is a resin where all repeating units comprise a (meth)acrylate repeating unit.

11. The positive resist composition according to claim 1, wherein the amount of the resin (A) added in the positive resist composition is from 70 to 99.5%, based on the entire solids content.

12. The positive resist composition according to claim 1, wherein the resin (C) contains at least one selected from the group consisting of (x) an alkali-soluble group, (y) a group capable of decomposing under the action of an alkali developer to increase the solubility in an alkali developer, and (z) a group capable of producing an alkali-soluble group under the action of an acid.

13. The positive resist composition according to claim 1, wherein the resin (A) has a lactone ring.

14. The positive resist composition according to claim 1, wherein in the organic group of P in formula (1), the total number of fluorine atoms and silicon atoms is from 5 to 10.

15. A positive resist composition, which comprises:
(A) a resin of which solubility in an alkali developer increases under an action of an acid, the resin (A) having a lactone ring;
(B) a compound capable of generating an acid upon irradiation with actinic rays or radiation;
(C) a resin having at least one of a fluorine atom and a silicon atom; and
(D) a solvent,
wherein the resin (A) is a resin where all repeating units comprise a (meth)acrylate repeating unit, and
wherein the resin (C) is (C2) a resin containing a repeating unit having at least one of a fluorine atom and a silicon atom in a side chain and a repeating unit having an unsubstituted alkyl group in a side chain, and the added amount of the resin (C2) is from 0.1 to 5.0 mass % based on the entire solids content of the composition, and
wherein the resin (C2) contains a repeating unit having at least one of a fluorine atom and a silicon atom in a side chain represented by formula (1) and a repeating unit having an unsubstituted alkyl group in a side chain represented by formula (2):

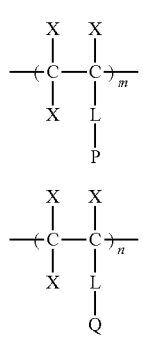

wherein X represents a hydrogen atom, a halogenated or unsubstituted alkyl group or a halogen atom;
L represents a linking group;
P represents an organic group having at least either one of a fluorine atom and a silicon atom;
Q represents an unsubstituted alkyl group, which is branched or cyclic; and
the molar ratio m/n is from 1/99 to 99/1.

16. A pattern forming method, which comprises:
forming a resist film from a positive resist composition according to claim 15; and
subjecting the resist film to immersion exposure and development.

17. The positive resist composition according to claim 15, wherein L represents a single bond, or a sole group or a combination of two or more groups, selected from the group consisting of an alkylene group, a cycloalkylene group, an ether group, a thioether group, a carbonyl group, an ester group, an amido group, a sulfonamide group, a urethane group and a urea group.

18. The positive resist composition according to claim 17, wherein L represents an ether group or an ester group.

19. The positive resist composition according to claim 15, wherein the organic group represented by P has a carbon atom of 20 or less.

20. The positive resist composition according to claim 15, wherein the organic group represented by P has a total number of fluorine atoms and silicon atoms from 3 to 15.

21. The positive resist composition according to claim 15, wherein the unsubstituted alkyl group represented by Q in formula (2) has a carbon number of 4 to 20.

22. The positive resist composition according to claim 15, wherein the resin (A) does not have a fluorine atom.

23. The positive resist composition according to claim 15, wherein the resin (A) has no aromatic group.

24. The positive resist composition according to claim 15, wherein the amount of the resin (A) added in the positive resist composition is from 70 to 99.5%, based on the entire solid content.

25. The positive resist composition according to claim 15, wherein the resin (C) contains at least one selected from the group consisting of (x) an alkali-soluble group, (y) a group capable of decomposing under the action of an alkali developer to increase the solubility in an alkali developer, and (z) a group capable of producing an alkali-soluble group under the action of an acid.

26. The positive resist composition according to claim 15, wherein in the organic group of P in formula (1), the total number of fluorine atoms and silicon atoms is from 5 to 10.

27. A positive resist composition, which comprises:
(A) a resin of which solubility in an alkali developer increases under an action of an acid;
(B) a compound capable of generating an acid upon irradiation with actinic rays or radiation;
(C) a resin having the following structure (C-8) or (C-10); and
(D) a solvent:

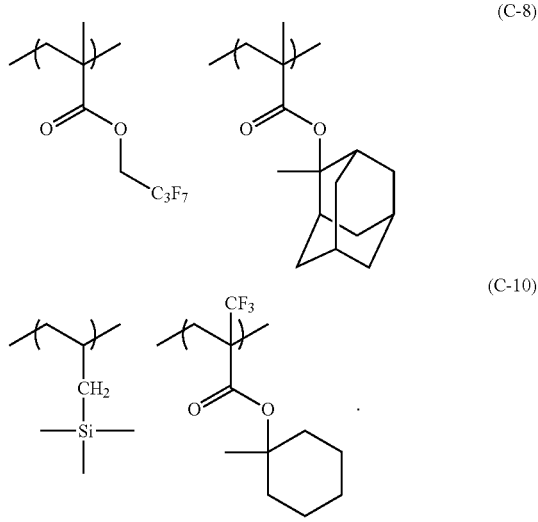

* * * * *